(12) United States Patent
Filman et al.

(10) Patent No.: US 9,166,313 B2
(45) Date of Patent: Oct. 20, 2015

(54) POWER SUPPLY CONTACT FOR INSTALLATION OF PRINTED CIRCUIT BOARD

(71) Applicant: MEDIMOP Medical Projects Ltd., Ra'anana (IL)

(72) Inventors: Reuven Y. Filman, Netanya (IL); Tomer Solomon, Modiin (IL)

(73) Assignee: Medimop Medical Projects, Ra'anana (IL)

( * ) Notice: Subject to any disclaimer, the term of this patent is extended or adjusted under 35 U.S.C. 154(b) by 0 days.

(21) Appl. No.: 14/638,525

(22) Filed: Mar. 4, 2015

(65) Prior Publication Data

US 2015/0180146 A1    Jun. 25, 2015

Related U.S. Application Data

(63) Continuation of application No. 13/873,335, filed on Apr. 30, 2013, now Pat. No. 9,011,164.

(51) Int. Cl.
*H01R 12/70* (2011.01)
(52) U.S. Cl.
CPC .................................. *H01R 12/7088* (2013.01)
(58) Field of Classification Search
CPC .............................. H01R 13/6315; H01R 12/57
See application file for complete search history.

(56) References Cited

U.S. PATENT DOCUMENTS

| | | |
|---|---|---|
| 1,795,630 A | 3/1931 | Wilson |
| 2,860,635 A | 11/1958 | Wilburn |
| 3,203,269 A | 8/1965 | Perrine |
| 3,212,685 A | 10/1965 | Swan et al. |
| 3,794,028 A | 2/1974 | Mueller et al. |
| 3,994,295 A | 11/1976 | Wulff |
| 4,195,636 A | 4/1980 | Behnke |
| 4,218,724 A | 8/1980 | Kaufman |
| 4,273,122 A | 6/1981 | Whitney et al. |
| 4,300,554 A | 11/1981 | Hessberg et al. |
| 4,403,987 A | 9/1983 | Gottinger |
| 4,435,173 A | 3/1984 | Siposs et al. |
| 4,465,478 A | 8/1984 | Sabelman et al. |

(Continued)

FOREIGN PATENT DOCUMENTS

| | | |
|---|---|---|
| CN | 1747683 A | 3/2006 |
| CN | 1863566 A | 11/2006 |

(Continued)

OTHER PUBLICATIONS

Daikyo Crystal Zenith® polymer, Manufactured by Daikyo Seiko, Ltd. (Jun. 25, 2008).

(Continued)

*Primary Examiner* — Gary Paumen
(74) *Attorney, Agent, or Firm* — Panitch Schwarze Belisario & Nadel LLP

(57) ABSTRACT

A power supply contact is mountable on a base of a device having a geometry for receiving a power supply and for surface installation of a printed circuit board. The power supply contact includes a base plate mountable on the base of the device, a rail extends upwardly from the base plate, a power supply terminal and an adaptor connecting the rail to the power supply terminal. The rail is in electrical contact with the printed circuit board and the power supply terminal is in electrical contact with the power supply when the printed circuit board and the power supply are installed in the device.

10 Claims, 11 Drawing Sheets

(56) References Cited

U.S. PATENT DOCUMENTS

| | | |
|---|---|---|
| 4,565,543 A | 1/1986 | Bekkering et al. |
| 4,585,439 A | 4/1986 | Michel |
| 4,599,082 A | 7/1986 | Grimard |
| 4,601,702 A | 7/1986 | Hudson |
| 4,685,903 A | 8/1987 | Cable et al. |
| 4,698,055 A | 10/1987 | Sealfon |
| 4,810,215 A * | 3/1989 | Kaneko ................... 439/845 |
| 4,850,966 A | 7/1989 | Grau et al. |
| 4,867,743 A | 9/1989 | Vaillancourt |
| 4,886,499 A | 12/1989 | Cirelli et al. |
| 4,919,596 A | 4/1990 | Slate et al. |
| 4,929,241 A | 5/1990 | Kulli |
| 4,950,246 A | 8/1990 | Muller |
| D322,671 S | 12/1991 | Szwarc |
| 5,109,850 A | 5/1992 | Blanco et al. |
| 5,112,317 A | 5/1992 | Michel |
| 5,131,816 A | 7/1992 | Brown et al. |
| 5,190,521 A | 3/1993 | Hubbard et al. |
| 5,254,096 A | 10/1993 | Rondelet et al. |
| 5,300,045 A | 4/1994 | Plassche, Jr. |
| 5,342,313 A | 8/1994 | Campbell et al. |
| 5,348,544 A | 9/1994 | Sweeney et al. |
| 5,366,498 A | 11/1994 | Brannan et al. |
| 5,383,865 A | 1/1995 | Michel |
| 5,478,315 A | 12/1995 | Brothers et al. |
| 5,482,446 A | 1/1996 | Williamson et al. |
| 5,496,274 A | 3/1996 | Graves et al. |
| 5,501,665 A | 3/1996 | Jhuboo et al. |
| 5,505,709 A | 4/1996 | Funderburk et al. |
| 5,562,686 A | 10/1996 | Sauer et al. |
| 5,593,390 A | 1/1997 | Castellano et al. |
| 5,616,132 A | 4/1997 | Newman |
| 5,643,218 A | 7/1997 | Lynn et al. |
| 5,645,955 A | 7/1997 | Maglica |
| 5,647,853 A | 7/1997 | Feldmann et al. |
| 5,662,678 A | 9/1997 | Macklin |
| 5,672,160 A | 9/1997 | Osterlind et al. |
| 5,690,618 A | 11/1997 | Smith et al. |
| D393,314 S | 4/1998 | Meisner et al. |
| 5,766,186 A | 6/1998 | Faraz et al. |
| 5,795,675 A | 8/1998 | Maglica |
| 5,800,420 A | 9/1998 | Gross et al. |
| 5,807,375 A | 9/1998 | Gross et al. |
| 5,814,020 A | 9/1998 | Gross |
| 5,836,920 A | 11/1998 | Robertson |
| 5,848,991 A | 12/1998 | Gross et al. |
| 5,851,197 A | 12/1998 | Marano et al. |
| 5,858,001 A | 1/1999 | Tsals et al. |
| 5,858,008 A | 1/1999 | Capaccio |
| 5,868,710 A | 2/1999 | Battiato et al. |
| 5,931,814 A | 8/1999 | Alex et al. |
| 5,941,850 A | 8/1999 | Shah et al. |
| 5,948,392 A | 9/1999 | Haslwanter et al. |
| 5,954,697 A | 9/1999 | Srisathapat et al. |
| 5,957,895 A | 9/1999 | Sage et al. |
| 5,968,011 A | 10/1999 | Larsen et al. |
| 5,993,423 A | 11/1999 | Choi |
| 6,004,297 A | 12/1999 | Steenfeldt-Jensen et al. |
| 6,033,245 A * | 3/2000 | Yamkovoy ................ 439/246 |
| 6,033,377 A | 3/2000 | Rasmussen et al. |
| 6,064,797 A | 5/2000 | Crittendon et al. |
| 6,074,369 A | 6/2000 | Sage et al. |
| 6,186,982 B1 | 2/2001 | Gross et al. |
| 6,200,289 B1 | 3/2001 | Hochman et al. |
| 6,200,296 B1 | 3/2001 | Dibiasi et al. |
| 6,224,569 B1 | 5/2001 | Brimhall |
| 6,248,093 B1 | 6/2001 | Moberg |
| 6,277,095 B1 | 8/2001 | Kriesel et al. |
| 6,277,098 B1 | 8/2001 | Klitmose et al. |
| 6,277,099 B1 | 8/2001 | Strowe et al. |
| 6,287,283 B1 | 9/2001 | Ljunggreen et al. |
| 6,293,925 B1 | 9/2001 | Safabash et al. |
| 6,336,729 B1 | 1/2002 | Pavelle et al. |
| 6,345,968 B1 | 2/2002 | Shupe |
| 6,377,848 B1 | 4/2002 | Garde et al. |
| 6,391,005 B1 | 5/2002 | Lum et al. |
| 6,423,029 B1 | 7/2002 | Elsberry |
| D465,026 S | 10/2002 | May et al. |
| 6,458,102 B1 | 10/2002 | Mann et al. |
| 6,485,461 B1 | 11/2002 | Mason et al. |
| 6,485,465 B2 | 11/2002 | Moberg et al. |
| 6,500,150 B1 | 12/2002 | Gross et al. |
| 6,503,231 B1 | 1/2003 | Prausnitz et al. |
| 6,511,336 B1 * | 1/2003 | Turek et al. ................ 439/249 |
| 6,517,517 B1 | 2/2003 | Farrugia et al. |
| D471,274 S | 3/2003 | Diaz et al. |
| D471,983 S | 3/2003 | Hippolyte et al. |
| 6,558,351 B1 | 5/2003 | Steil et al. |
| 6,589,229 B1 | 7/2003 | Connelly et al. |
| 6,595,956 B1 | 7/2003 | Gross et al. |
| 6,595,960 B2 | 7/2003 | West et al. |
| 6,645,181 B1 | 11/2003 | Lavi et al. |
| 6,652,482 B2 | 11/2003 | Hochman |
| 6,656,158 B2 | 12/2003 | Mahoney et al. |
| 6,656,159 B2 | 12/2003 | Flaherty |
| 6,659,980 B2 | 12/2003 | Moberg et al. |
| 6,673,033 B1 | 1/2004 | Sciulli et al. |
| 6,679,862 B2 | 1/2004 | Diaz et al. |
| 6,689,118 B2 | 2/2004 | Alchas et al. |
| 6,699,218 B2 | 3/2004 | Flaherty et al. |
| 6,722,916 B2 * | 4/2004 | Buccinna et al. ............. 439/500 |
| 6,743,211 B1 | 6/2004 | Prausnitz et al. |
| 6,749,587 B2 | 6/2004 | Flaherty |
| 6,752,787 B1 | 6/2004 | Causey, III et al. |
| 6,768,425 B2 | 7/2004 | Flaherty et al. |
| 6,786,890 B2 | 9/2004 | Preuthun et al. |
| 6,800,071 B1 | 10/2004 | McConnell et al. |
| 6,805,687 B2 | 10/2004 | Dextradeur et al. |
| 6,824,529 B2 | 11/2004 | Gross et al. |
| 6,843,782 B2 | 1/2005 | Gross et al. |
| 6,854,620 B2 | 2/2005 | Ramey |
| 6,905,298 B1 | 6/2005 | Haring |
| 6,908,452 B2 | 6/2005 | Diaz et al. |
| 6,960,192 B1 | 11/2005 | Flaherty et al. |
| 6,997,727 B1 * | 2/2006 | Legrady et al. ............. 439/246 |
| 7,001,360 B2 | 2/2006 | Veasey et al. |
| 7,034,223 B2 * | 4/2006 | Fan et al. ................... 174/51 |
| 7,048,715 B2 | 5/2006 | Diaz et al. |
| 7,060,054 B2 | 6/2006 | Nissels |
| 7,060,059 B2 | 6/2006 | Keith et al. |
| 7,097,637 B2 | 8/2006 | Triplett et al. |
| 7,128,727 B2 | 10/2006 | Flaherty et al. |
| 7,144,384 B2 | 12/2006 | Gorman et al. |
| D544,092 S | 6/2007 | Lewis |
| 7,225,694 B2 | 6/2007 | Said |
| 7,247,149 B2 | 7/2007 | Beyerlein |
| 7,250,037 B2 | 7/2007 | Shermer et al. |
| 7,267,669 B2 | 9/2007 | Staunton et al. |
| 7,291,132 B2 | 11/2007 | DeRuntz et al. |
| 7,291,159 B2 | 11/2007 | Schmelzeisen-Redeker et al. |
| 7,303,549 B2 | 12/2007 | Flaherty et al. |
| 7,344,385 B2 | 3/2008 | Chen |
| 7,364,570 B2 | 4/2008 | Gerondale et al. |
| 7,390,314 B2 | 6/2008 | Stutz, Jr. et al. |
| 7,407,493 B2 | 8/2008 | Cane' |
| D578,210 S | 10/2008 | Muta et al. |
| 7,455,663 B2 | 11/2008 | Bikovsky |
| 7,465,290 B2 | 12/2008 | Reilly |
| 7,488,181 B2 * | 2/2009 | van Haaster ................. 439/66 |
| 7,497,842 B2 | 3/2009 | Diaz et al. |
| 7,501,587 B2 * | 3/2009 | English ................... 174/354 |
| 7,503,786 B2 * | 3/2009 | Kato et al. ................. 439/239 |
| 7,530,964 B2 | 5/2009 | Lavi et al. |
| 7,547,281 B2 | 6/2009 | Hayes et al. |
| 7,565,208 B2 | 7/2009 | Harris et al. |
| 7,569,050 B2 | 8/2009 | Moberg et al. |
| D600,341 S | 9/2009 | Loerwald |
| 7,585,287 B2 | 9/2009 | Bresina et al. |
| 7,588,559 B2 | 9/2009 | Aravena et al. |
| 7,589,974 B2 | 9/2009 | Grady et al. |
| D602,155 S | 10/2009 | Foley et al. |
| D602,586 S | 10/2009 | Foley et al. |
| D604,835 S | 11/2009 | Conley |
| 7,628,770 B2 | 12/2009 | Ethelfeld |

(56) References Cited

U.S. PATENT DOCUMENTS

| | | |
|---|---|---|
| 7,628,772 B2 | 12/2009 | McConnell et al. |
| 7,628,782 B2 | 12/2009 | Adair et al. |
| 7,637,891 B2 | 12/2009 | Wall |
| 7,637,899 B2 | 12/2009 | Woolston et al. |
| 7,641,649 B2 | 1/2010 | Moberg et al. |
| 7,660,627 B2 | 2/2010 | McNichols et al. |
| 7,678,079 B2 | 3/2010 | Shermer et al. |
| 7,682,338 B2 | 3/2010 | Griffin |
| 7,686,787 B2 | 3/2010 | Moberg et al. |
| 7,699,829 B2 | 4/2010 | Harris et al. |
| 7,699,833 B2 | 4/2010 | Moberg et al. |
| 7,704,088 B2 * | 4/2010 | Sakamoto ............... 439/246 |
| 7,704,227 B2 | 4/2010 | Moberg et al. |
| 7,704,229 B2 | 4/2010 | Moberg et al. |
| 7,704,231 B2 | 4/2010 | Pongpairochana et al. |
| 7,708,717 B2 | 5/2010 | Estes et al. |
| 7,713,238 B2 | 5/2010 | Mernoe |
| 7,713,240 B2 | 5/2010 | Istoc et al. |
| 7,717,913 B2 | 5/2010 | Novak et al. |
| 7,722,574 B2 | 5/2010 | Toman et al. |
| 7,736,344 B2 | 6/2010 | Moberg et al. |
| 7,744,589 B2 | 6/2010 | Mounce et al. |
| 7,749,194 B2 | 7/2010 | Edwards et al. |
| 7,776,030 B2 | 8/2010 | Estes et al. |
| 7,780,637 B2 | 8/2010 | Jerde et al. |
| 7,789,857 B2 | 9/2010 | Moberg et al. |
| 7,801,599 B2 | 9/2010 | Young et al. |
| 7,806,868 B2 | 10/2010 | De Polo et al. |
| 7,828,528 B2 | 11/2010 | Estes et al. |
| 7,837,659 B2 | 11/2010 | Bush, Jr. et al. |
| 7,846,132 B2 | 12/2010 | Gravesen et al. |
| 7,854,723 B2 | 12/2010 | Hwang et al. |
| 7,857,131 B2 | 12/2010 | Vedrine |
| 7,879,025 B2 | 2/2011 | Jacobson et al. |
| 7,918,825 B2 | 4/2011 | O'Connor et al. |
| 7,935,104 B2 | 5/2011 | Yodfat et al. |
| 7,935,105 B2 | 5/2011 | Miller et al. |
| 7,938,803 B2 | 5/2011 | Mernoe et al. |
| 7,955,305 B2 | 6/2011 | Moberg et al. |
| 7,967,784 B2 | 6/2011 | Pongpairochana et al. |
| 7,967,795 B1 | 6/2011 | Cabiri |
| 7,981,105 B2 | 7/2011 | Adair et al. |
| 7,988,683 B2 | 8/2011 | Adair et al. |
| 7,993,300 B2 | 8/2011 | Nyholm et al. |
| 7,993,301 B2 | 8/2011 | Boyd et al. |
| 7,998,111 B2 | 8/2011 | Moberg et al. |
| 8,021,357 B2 | 9/2011 | Tanaka et al. |
| 8,025,658 B2 | 9/2011 | Chong et al. |
| 8,029,469 B2 | 10/2011 | Ethelfeld |
| 8,034,019 B2 | 10/2011 | Nair et al. |
| 8,038,666 B2 | 10/2011 | Triplett et al. |
| 8,057,431 B2 | 11/2011 | Woehr et al. |
| 8,057,436 B2 | 11/2011 | Causey et al. |
| 8,062,253 B2 | 11/2011 | Nielsen et al. |
| 8,066,694 B2 | 11/2011 | Wagener |
| D650,079 S | 12/2011 | Presta et al. |
| D650,903 S | 12/2011 | Kosinski et al. |
| 8,086,306 B2 | 12/2011 | Katzman et al. |
| D652,503 S | 1/2012 | Cameron et al. |
| 8,105,279 B2 | 1/2012 | Mernoe et al. |
| 8,114,046 B2 | 2/2012 | Covino et al. |
| 8,114,064 B2 | 2/2012 | Alferness et al. |
| 8,114,066 B2 | 2/2012 | Naef et al. |
| D657,462 S | 4/2012 | Siroky |
| 8,147,446 B2 | 4/2012 | Yodfat et al. |
| 8,152,764 B2 | 4/2012 | Istoc et al. |
| 8,152,770 B2 | 4/2012 | Reid |
| 8,152,779 B2 | 4/2012 | Cabiri |
| 8,152,793 B2 | 4/2012 | Keinanen et al. |
| 8,157,693 B2 | 4/2012 | Waksmundzki |
| 8,157,769 B2 | 4/2012 | Cabiri |
| 8,162,674 B2 | 4/2012 | Cho et al. |
| 8,162,923 B2 | 4/2012 | Adams et al. |
| 8,167,841 B2 | 5/2012 | Teisen-Simony et al. |
| 8,172,591 B2 * | 5/2012 | Wertz ............... 439/246 |
| 8,172,804 B2 | 5/2012 | Bikovsky |
| 8,182,462 B2 | 5/2012 | Istoc et al. |
| 8,197,444 B1 | 6/2012 | Bazargan et al. |
| 8,206,351 B2 | 6/2012 | Sugimoto et al. |
| 8,221,356 B2 | 7/2012 | Enggaard et al. |
| 8,267,921 B2 | 9/2012 | Yodfat et al. |
| 8,287,520 B2 | 10/2012 | Drew et al. |
| 8,292,647 B1 | 10/2012 | McGrath et al. |
| 8,308,679 B2 | 11/2012 | Hanson et al. |
| 8,323,250 B2 | 12/2012 | Chong et al. |
| 8,372,039 B2 | 2/2013 | Mernoe et al. |
| 8,373,421 B2 | 2/2013 | Lindegger et al. |
| 8,409,142 B2 | 4/2013 | Causey et al. |
| 8,414,557 B2 | 4/2013 | Istoc et al. |
| 8,430,847 B2 | 4/2013 | Mernoe et al. |
| 8,469,942 B2 | 6/2013 | Kow et al. |
| 8,474,332 B2 | 7/2013 | Bente, IV et al. |
| 8,475,408 B2 | 7/2013 | Mernoe et al. |
| 8,479,595 B2 | 7/2013 | Vazquez et al. |
| 8,495,918 B2 | 7/2013 | Bazargan et al. |
| 8,496,862 B2 | 7/2013 | Zelkovich et al. |
| 8,512,287 B2 | 8/2013 | Cindrich et al. |
| 8,517,987 B2 | 8/2013 | Istoc et al. |
| 8,523,803 B1 | 9/2013 | Favreau |
| 8,556,856 B2 | 10/2013 | Bazargan et al. |
| 8,562,364 B2 * | 10/2013 | Lin et al. ............... 439/246 |
| 8,574,216 B2 | 11/2013 | Istoc et al. |
| 8,603,026 B2 | 12/2013 | Favreau |
| 8,603,027 B2 | 12/2013 | Favreau |
| 8,628,510 B2 | 1/2014 | Bazargan et al. |
| 8,674,288 B2 | 3/2014 | Hanson et al. |
| 8,679,060 B2 | 3/2014 | Mernoe et al. |
| 8,690,855 B2 | 4/2014 | Alderete, Jr. et al. |
| 8,708,961 B2 | 4/2014 | Field et al. |
| 8,751,237 B2 | 6/2014 | Kubota |
| 8,753,326 B2 | 6/2014 | Chong et al. |
| 8,753,331 B2 | 6/2014 | Murphy |
| 8,764,707 B2 | 7/2014 | Moberg et al. |
| 8,764,723 B2 | 7/2014 | Chong et al. |
| 8,771,222 B2 | 7/2014 | Kanderian, Jr. et al. |
| 8,777,896 B2 | 7/2014 | Starkweather et al. |
| 8,777,924 B2 | 7/2014 | Kanderian, Jr. et al. |
| 8,777,925 B2 | 7/2014 | Patton |
| 8,784,369 B2 | 7/2014 | Starkweather et al. |
| 8,784,370 B2 | 7/2014 | Lebel et al. |
| 8,790,295 B1 | 7/2014 | Sigg et al. |
| 8,795,224 B2 | 8/2014 | Starkweather et al. |
| 8,795,231 B2 | 8/2014 | Chong et al. |
| 8,795,260 B2 | 8/2014 | Drew |
| 8,801,668 B2 | 8/2014 | Ali et al. |
| 8,801,679 B2 | 8/2014 | Iio et al. |
| 8,810,394 B2 | 8/2014 | Kalpin |
| 8,814,379 B2 | 8/2014 | Griffiths et al. |
| 8,920,374 B2 | 12/2014 | Bokelman et al. |
| 9,061,104 B2 | 6/2015 | Daniel |
| 9,061,110 B2 | 6/2015 | Avery et al. |
| 9,089,475 B2 | 7/2015 | Fangrow |
| 9,089,641 B2 | 7/2015 | Kavazov |
| 2001/0025168 A1 | 9/2001 | Gross et al. |
| 2001/0041869 A1 | 11/2001 | Causey et al. |
| 2002/0010423 A1 | 1/2002 | Gross et al. |
| 2002/0029018 A1 | 3/2002 | Jeffrey |
| 2002/0040208 A1 | 4/2002 | Flaherty et al. |
| 2002/0055711 A1 | 5/2002 | Lavi et al. |
| 2002/0065488 A1 | 5/2002 | Suzuki et al. |
| 2002/0107487 A1 | 8/2002 | Preuthun |
| 2002/0123740 A1 | 9/2002 | Flaherty et al. |
| 2002/0169215 A1 | 11/2002 | Meng |
| 2003/0009133 A1 | 1/2003 | Ramey |
| 2003/0125671 A1 | 7/2003 | Aramata et al. |
| 2003/0135159 A1 | 7/2003 | Daily et al. |
| 2003/0160683 A1 | 8/2003 | Blomquist |
| 2003/0171717 A1 | 9/2003 | Farrugia et al. |
| 2004/0010207 A1 | 1/2004 | Flaherty et al. |
| 2004/0092873 A1 | 5/2004 | Moberg |
| 2004/0116866 A1 | 6/2004 | Gorman et al. |
| 2004/0127857 A1 | 7/2004 | Shemesh et al. |
| 2004/0158172 A1 | 8/2004 | Hancock |
| 2004/0186419 A1 | 9/2004 | Cho |

(56) References Cited

U.S. PATENT DOCUMENTS

| | | |
|---|---|---|
| 2004/0260233 A1 | 12/2004 | Garibotto et al. |
| 2005/0033234 A1 | 2/2005 | Sadowski et al. |
| 2005/0065466 A1 | 3/2005 | Vedrine |
| 2005/0065472 A1 | 3/2005 | Cindrich et al. |
| 2005/0071487 A1 | 3/2005 | Lu et al. |
| 2005/0113761 A1 | 5/2005 | Faust et al. |
| 2005/0159706 A1 | 7/2005 | Wilkinson et al. |
| 2005/0171476 A1 | 8/2005 | Judson et al. |
| 2005/0171512 A1 | 8/2005 | Flaherty |
| 2005/0177136 A1 | 8/2005 | Miller |
| 2005/0197650 A1 | 9/2005 | Sugimoto et al. |
| 2005/0203461 A1 | 9/2005 | Flaherty et al. |
| 2005/0238507 A1 | 10/2005 | Dilanni et al. |
| 2005/0283114 A1 | 12/2005 | Bresina et al. |
| 2006/0030816 A1 | 2/2006 | Zubry |
| 2006/0095014 A1 | 5/2006 | Ethelfeld |
| 2006/0122577 A1 | 6/2006 | Poulsen et al. |
| 2006/0173406 A1 | 8/2006 | Hayes et al. |
| 2006/0173439 A1 | 8/2006 | Thorne et al. |
| 2006/0195029 A1 | 8/2006 | Shults et al. |
| 2006/0211982 A1 | 9/2006 | Prestrelski et al. |
| 2006/0229569 A1 | 10/2006 | Lavi et al. |
| 2006/0264889 A1 | 11/2006 | Moberg et al. |
| 2006/0264890 A1 | 11/2006 | Moberg et al. |
| 2006/0264894 A1 | 11/2006 | Moberg et al. |
| 2006/0270987 A1 | 11/2006 | Peter |
| 2006/0283465 A1 | 12/2006 | Nickel et al. |
| 2006/0293722 A1 | 12/2006 | Slatkine et al. |
| 2007/0021733 A1 | 1/2007 | Hansen et al. |
| 2007/0049865 A1 | 3/2007 | Radmer et al. |
| 2007/0073228 A1 | 3/2007 | Mernoe et al. |
| 2007/0118405 A1 | 5/2007 | Campbell et al. |
| 2007/0167912 A1 | 7/2007 | Causey et al. |
| 2007/0185449 A1 | 8/2007 | Mernoe |
| 2007/0197968 A1 | 8/2007 | Pongpairochana et al. |
| 2007/0203454 A1 | 8/2007 | Shermer et al. |
| 2007/0233038 A1 | 10/2007 | Pruitt et al. |
| 2007/0282269 A1 | 12/2007 | Carter et al. |
| 2008/0021439 A1 | 1/2008 | Brittingham et al. |
| 2008/0033367 A1 | 2/2008 | Haury et al. |
| 2008/0033369 A1 | 2/2008 | Kohlbrenner et al. |
| 2008/0033393 A1 | 2/2008 | Edwards et al. |
| 2008/0051711 A1 | 2/2008 | Mounce et al. |
| 2008/0051730 A1 | 2/2008 | Bikovsky |
| 2008/0059133 A1 | 3/2008 | Edwards et al. |
| 2008/0097381 A1 | 4/2008 | Moberg et al. |
| 2008/0108951 A1 | 5/2008 | Jerde et al. |
| 2008/0140006 A1 | 6/2008 | Eskuri et al. |
| 2008/0140018 A1 | 6/2008 | Enggaard et al. |
| 2008/0147004 A1 | 6/2008 | Mann et al. |
| 2008/0167641 A1 | 7/2008 | Hansen et al. |
| 2008/0188813 A1 | 8/2008 | Miller et al. |
| 2008/0208138 A1 | 8/2008 | Lim et al. |
| 2008/0215006 A1 | 9/2008 | Thorkild |
| 2008/0215015 A1 | 9/2008 | Cindrich et al. |
| 2008/0243087 A1 | 10/2008 | Enggaard et al. |
| 2008/0249473 A1 | 10/2008 | Rutti et al. |
| 2008/0262436 A1 | 10/2008 | Olson |
| 2008/0269687 A1 | 10/2008 | Chong et al. |
| 2008/0269723 A1 | 10/2008 | Mastrototaro et al. |
| 2008/0274630 A1 | 11/2008 | Shelton et al. |
| 2008/0294143 A1 | 11/2008 | Tanaka et al. |
| 2008/0306449 A1 | 12/2008 | Kristensen et al. |
| 2008/0312601 A1 | 12/2008 | Cane |
| 2008/0319416 A1 | 12/2008 | Yodfat et al. |
| 2009/0041805 A1 | 2/2009 | Walker |
| 2009/0048347 A1 | 2/2009 | Cohen et al. |
| 2009/0054750 A1 | 2/2009 | Jennewine |
| 2009/0069784 A1 | 3/2009 | Estes et al. |
| 2009/0076453 A1 | 3/2009 | Mejlhede et al. |
| 2009/0088694 A1 | 4/2009 | Carter et al. |
| 2009/0088731 A1 | 4/2009 | Campbell et al. |
| 2009/0093792 A1 | 4/2009 | Gross et al. |
| 2009/0093793 A1 | 4/2009 | Gross et al. |
| 2009/0105650 A1 | 4/2009 | Wiegel et al. |
| 2009/0124977 A1 | 5/2009 | Jensen |
| 2009/0143730 A1 | 6/2009 | De Polo et al. |
| 2009/0143735 A1 | 6/2009 | De Polo et al. |
| 2009/0149830 A1 | 6/2009 | Spector |
| 2009/0182277 A1 | 7/2009 | Carter |
| 2009/0204076 A1 | 8/2009 | Liversidge |
| 2009/0209896 A1 | 8/2009 | Selevan |
| 2009/0234319 A1 | 9/2009 | Marksteiner |
| 2009/0240240 A1 | 9/2009 | Hines et al. |
| 2009/0253973 A1 | 10/2009 | Bashan et al. |
| 2009/0259176 A1 | 10/2009 | Yairi |
| 2009/0281585 A1 | 11/2009 | Katzman et al. |
| 2009/0299290 A1 | 12/2009 | Moberg |
| 2009/0299397 A1 | 12/2009 | Ruan et al. |
| 2009/0326459 A1 | 12/2009 | Shipway et al. |
| 2009/0326509 A1 | 12/2009 | Muse et al. |
| 2010/0030156 A1 | 2/2010 | Beebe et al. |
| 2010/0030198 A1 | 2/2010 | Beebe et al. |
| 2010/0049128 A1 | 2/2010 | McKenzie et al. |
| 2010/0049144 A1 | 2/2010 | McConnell et al. |
| 2010/0057057 A1 | 3/2010 | Hayter et al. |
| 2010/0076412 A1 | 3/2010 | Rush et al. |
| 2010/0094255 A1 | 4/2010 | Nycz et al. |
| 2010/0100076 A1 | 4/2010 | Rush et al. |
| 2010/0100077 A1 | 4/2010 | Rush et al. |
| 2010/0106098 A1 | 4/2010 | Atterbury et al. |
| 2010/0121314 A1 | 5/2010 | Iobbi |
| 2010/0137790 A1 | 6/2010 | Yodfat |
| 2010/0137831 A1 | 6/2010 | Tsals |
| 2010/0145303 A1 | 6/2010 | Yodfat et al. |
| 2010/0145305 A1 | 6/2010 | Alon |
| 2010/0162548 A1 | 7/2010 | Leidig |
| 2010/0168607 A1 | 7/2010 | Miesel |
| 2010/0168683 A1 | 7/2010 | Cabiri |
| 2010/0198157 A1 | 8/2010 | Gyrn et al. |
| 2010/0204657 A1 | 8/2010 | Yodfat et al. |
| 2010/0234767 A1 | 9/2010 | Sarstedt |
| 2010/0234830 A1 | 9/2010 | Straessler et al. |
| 2010/0241065 A1 | 9/2010 | Moberg et al. |
| 2010/0264931 A1 | 10/2010 | Lindegger et al. |
| 2010/0274112 A1 | 10/2010 | Hoss et al. |
| 2010/0274192 A1 | 10/2010 | Mernoe |
| 2010/0280499 A1 | 11/2010 | Yodfat et al. |
| 2010/0331826 A1 | 12/2010 | Field et al. |
| 2011/0034900 A1 | 2/2011 | Yodfat et al. |
| 2011/0054399 A1 | 3/2011 | Chong et al. |
| 2011/0054400 A1 | 3/2011 | Chong et al. |
| 2011/0125056 A1 | 5/2011 | Merchant |
| 2011/0160654 A1 | 6/2011 | Hanson et al. |
| 2011/0160666 A1 | 6/2011 | Hanson et al. |
| 2011/0160669 A1 | 6/2011 | Gyrn et al. |
| 2011/0172645 A1 | 7/2011 | Moga et al. |
| 2011/0172745 A1 | 7/2011 | Na et al. |
| 2011/0178472 A1 | 7/2011 | Cabiri |
| 2011/0201998 A1 | 8/2011 | Pongpairochana et al. |
| 2011/0238031 A1 | 9/2011 | Adair et al. |
| 2011/0245773 A1 | 10/2011 | Estes et al. |
| 2011/0270160 A1 | 11/2011 | Mernoe |
| 2011/0282282 A1 | 11/2011 | Lorenzen et al. |
| 2011/0282296 A1 | 11/2011 | Harms et al. |
| 2011/0295205 A1 | 12/2011 | Kaufmann et al. |
| 2011/0313238 A1 | 12/2011 | Reichenbach et al. |
| 2011/0319861 A1 | 12/2011 | Wilk |
| 2011/0319919 A1 | 12/2011 | Curry et al. |
| 2012/0004602 A1 | 1/2012 | Hanson et al. |
| 2012/0010594 A1 | 1/2012 | Holt et al. |
| 2012/0022344 A1 | 1/2012 | Kube |
| 2012/0022499 A1 | 1/2012 | Anderson et al. |
| 2012/0029431 A1 | 2/2012 | Hwang et al. |
| 2012/0035546 A1 | 2/2012 | Cabiri |
| 2012/0041364 A1 | 2/2012 | Smith |
| 2012/0041414 A1 | 2/2012 | Estes et al. |
| 2012/0071828 A1 | 3/2012 | Tojo et al. |
| 2012/0096953 A1 | 4/2012 | Bente, IV et al. |
| 2012/0096954 A1 | 4/2012 | Vazquez et al. |
| 2012/0101436 A1 | 4/2012 | Bazargan et al. |
| 2012/0108933 A1 | 5/2012 | Liang et al. |
| 2012/0129362 A1 | 5/2012 | Hampo et al. |
| 2012/0160033 A1 | 6/2012 | Kow et al. |

(56) References Cited

U.S. PATENT DOCUMENTS

| | | |
|---|---|---|
| 2012/0165733 A1 | 6/2012 | Bazargan et al. |
| 2012/0165780 A1 | 6/2012 | Bazargan et al. |
| 2012/0226234 A1 | 9/2012 | Bazargan et al. |
| 2012/0259282 A1 | 10/2012 | Alderete, Jr. et al. |
| 2013/0012875 A1 | 1/2013 | Gross et al. |
| 2013/0068319 A1 | 3/2013 | Plumptre et al. |
| 2013/0085457 A1 | 4/2013 | Schiff et al. |
| 2013/0089992 A1 | 4/2013 | Yang |
| 2013/0096509 A1 | 4/2013 | Avery et al. |
| 2013/0110049 A1 | 5/2013 | Cronenberg et al. |
| 2013/0133438 A1 | 5/2013 | Kow et al. |
| 2013/0237953 A1 | 9/2013 | Kow et al. |
| 2013/0245595 A1 | 9/2013 | Kow et al. |
| 2013/0253419 A1 | 9/2013 | Favreau |
| 2013/0253420 A1 | 9/2013 | Favreau |
| 2013/0253421 A1 | 9/2013 | Favreau |
| 2013/0323699 A1 | 12/2013 | Edwards et al. |
| 2013/0331791 A1 | 12/2013 | Gross et al. |
| 2014/0055073 A1 | 2/2014 | Favreau |
| 2014/0055076 A1 | 2/2014 | Favreau |
| 2014/0058349 A1 | 2/2014 | Bazargan et al. |
| 2014/0083517 A1 | 3/2014 | Moia et al. |
| 2014/0094755 A1 | 4/2014 | Bazargan et al. |
| 2014/0128807 A1 | 5/2014 | Moberg et al. |
| 2014/0128835 A1 | 5/2014 | Moberg et al. |
| 2014/0135692 A1 | 5/2014 | Alderete, Jr. et al. |
| 2014/0135694 A1 | 5/2014 | Moberg et al. |
| 2014/0142499 A1 | 5/2014 | Moberg et al. |
| 2014/0148784 A1 | 5/2014 | Anderson et al. |
| 2014/0148785 A1 | 5/2014 | Moberg et al. |
| 2014/0163522 A1 | 6/2014 | Alderete, Jr. et al. |
| 2014/0194819 A1 | 7/2014 | Maule et al. |
| 2014/0194854 A1 | 7/2014 | Tsals |
| 2014/0207064 A1 | 7/2014 | Yavorsky |
| 2014/0207065 A1 | 7/2014 | Yavorsky |
| 2014/0207066 A1 | 7/2014 | Yavorsky |
| 2014/0213975 A1 | 7/2014 | Clemente et al. |
| 2014/0236087 A1 | 8/2014 | Alderete, Jr. et al. |
| 2014/0261758 A1 | 9/2014 | Wlodarczyk et al. |

FOREIGN PATENT DOCUMENTS

| | | |
|---|---|---|
| CN | 101090749 A | 12/2007 |
| CN | 201941304 U | 8/2011 |
| CN | 102186733 A | 9/2011 |
| DE | 1064693 B | 9/1959 |
| EP | 0017412 A1 | 10/1980 |
| EP | 0222656 A1 | 5/1987 |
| EP | 0401179 A1 | 12/1990 |
| EP | 1530979 A1 | 5/2005 |
| EP | 1666080 A1 | 6/2006 |
| EP | 2060606 A1 | 5/2009 |
| EP | 2498589 A1 | 9/2012 |
| JP | H07-194701 A | 8/1995 |
| JP | H09-505758 A | 6/1997 |
| JP | 2001-512992 A | 8/2001 |
| JP | 2002-505601 A | 2/2002 |
| JP | 2002-507459 A | 3/2002 |
| JP | 2002-528676 A | 9/2002 |
| JP | 2003-501157 A | 1/2003 |
| JP | 2003-527138 A | 9/2003 |
| JP | 2003-534061 A | 11/2003 |
| JP | 2004-501721 A | 1/2004 |
| JP | 2004-512100 A | 4/2004 |
| JP | 2005-523127 A | 8/2005 |
| JP | 2005-270629 A | 10/2005 |
| JP | 2007-509661 A | 4/2007 |
| JP | 2008-534131 A | 8/2008 |
| JP | 2008-220961 A | 9/2008 |
| JP | 2009-502273 A | 1/2009 |
| WO | 9009202 A1 | 8/1990 |
| WO | 9307922 A1 | 4/1993 |
| WO | 9407553 A1 | 4/1994 |
| WO | 9513838 A1 | 5/1995 |
| WO | 9609083 A1 | 3/1996 |
| WO | 9632975 A1 | 10/1996 |
| WO | 9700091 A1 | 1/1997 |
| WO | 9710012 A1 | 3/1997 |
| WO | 9733638 A1 | 9/1997 |
| WO | 9857683 A1 | 12/1998 |
| WO | 9929151 A1 | 6/1999 |
| WO | 9959665 A1 | 11/1999 |
| WO | 0025844 A1 | 5/2000 |
| WO | 0187384 A1 | 11/2001 |
| WO | 0189607 A2 | 11/2001 |
| WO | 0189613 A1 | 11/2001 |
| WO | 0202165 A2 | 1/2002 |
| WO | 0234315 A1 | 5/2002 |
| WO | 02072182 A1 | 9/2002 |
| WO | 03090833 A1 | 11/2003 |
| WO | 2004032990 A2 | 4/2004 |
| WO | 2004105841 A1 | 12/2004 |
| WO | 2005018703 A2 | 3/2005 |
| WO | 2005037350 A2 | 4/2005 |
| WO | 2006037434 A1 | 4/2006 |
| WO | WO2006069380 A1 | 6/2006 |
| WO | 2006102676 A1 | 9/2006 |
| WO | 2006104806 A2 | 10/2006 |
| WO | 2007051563 A1 | 5/2007 |
| WO | 2007056504 A1 | 5/2007 |
| WO | 2008001377 A2 | 1/2008 |
| WO | 2008014908 A1 | 2/2008 |
| WO | 2008057976 A2 | 5/2008 |
| WO | 2008072229 A2 | 6/2008 |
| WO | 2008076459 A1 | 6/2008 |
| WO | 2008078318 A2 | 7/2008 |
| WO | 2009044401 | 4/2009 |
| WO | 2009046989 A2 | 4/2009 |
| WO | 2009125398 A2 | 10/2009 |
| WO | 2009144085 A2 | 12/2009 |
| WO | 2010078227 A1 | 7/2010 |
| WO | 2010078242 A1 | 7/2010 |
| WO | 2011077105 A1 | 6/2011 |
| WO | 2011090955 A1 | 7/2011 |
| WO | 2011156373 A1 | 12/2011 |
| WO | 2012032411 A2 | 3/2012 |
| WO | 2012040528 A1 | 3/2012 |
| WO | 2012160157 A1 | 11/2012 |
| WO | 2014179774 A1 | 11/2014 |

OTHER PUBLICATIONS

Copaxone®, Manufactured by Teva Pharmaceutical Industries Ltd. (2009).

Int'l Search Report issued May 13, 2009 in Int'l Application No. PCT/IL2008/001312.

Int'l Preliminary Report on Patentability issued Apr. 7, 2010 in Int'l Application No. PCT/IL2008/001312; Written Opinion.

Int'l Search Report issued Apr. 26, 2010 in Int'l Application No. PCT/US2009/069552.

Office Action issued Apr. 5, 2010 in U.S. Appl. No. 12/244,666.

Office Action issued Sep. 21, 2010 in U.S. Appl. No. 12/244,666.

Office Action issued Apr. 5, 2010 in U.S. Appl. No. 12/244,688.

Office Action issued Sep. 2, 2010 in U.S. Appl. No. 12/244,688.

Office Action issued Sep. 30, 2010 in U.S. Appl. No. 12/689,250.

Int'l Search Report issued Jan. 12, 2011 in Int'l Application No. PCT/US2010/048556; Written Opinion.

International Preliminary Report on Patentability issued on Jul. 5, 2011 in International Application No. PCT/US2009/069552; Written Opinion.

Office Action issued Jul. 13, 2011 in U.S. Appl. No. 12/559,563.

Int'l Preliminary Report on Patentability issued Sep. 1, 2011 in Int'l Application No. PCT/US2010/048556.

Office Action issued Sep. 6, 2011 in U.S. Appl. No. 12/345,818.

Office Action issued Feb. 21, 2012 in U.S. Appl. No. 12/689,249.

Int'l Search Report issued Jun. 17, 2011 in Int'l Application No. PCT/US2011/021604.

Int'l Search Report issued Oct. 12, 2011 in Int'l Application No. PCT/US2011/021605.

Office Action issued Oct. 28, 2011 in U.S. Appl. No. 12/615,828.

(56) References Cited

OTHER PUBLICATIONS

Int'l Search Report issued Sep. 22, 2011 in Int'l Application No. PCT/IL11/00368; Written Opinion.
U.S. Appl. No. 13/521,181 by Cabiri, filed Jul. 9, 2012.
U.S. Appl. No. 13/521,167 by Cabiri, filed Jul. 9, 2012.
Office Action issued May 16, 2012 in U.S. Appl. No. 12/615,828.
Office Action issued Jul. 2, 2012 in U.S. Appl. No. 13/272,555.
Office Action issued May 3, 2012 in CN Application No. 200880117084.X.
U.S. Appl. No. 13/472,112 by Cabiri, filed May 15, 2012.
U.S. Appl. No. 13/429,840 by Cabiri, filed Mar. 26, 2012.
Int'l Preliminary Report on Patentability issued Aug. 2, 2012 in Int'l Application No. PCT/US2011/021604.
U.S. Appl. No. 13/643,470 by Alon, filed Oct. 25, 2012.
U.S. Appl. No. 13/733,516 by Cabiri, filed Jan. 3, 2013.
Office Action issued Jan. 8, 2013 in JP Application No. 2010-527595.
Int'l Preliminary Report on Patentability issued Feb. 7, 2013 in Int'l Application No. PCT/US2011/021604.
Int'l Preliminary Report on Patentability issued Feb. 7, 2013 in Int'l Application No. PCT/US2011/021605.
English translation of an Office Action issued Jan. 30, 2013 in CN Application No. 200880117084.X.
U.S. Appl. No. 13/873,335 by Filman, filed Apr. 30, 2013.
U.S. Appl. No. 13/892,905 by Cabiri, filed May 13, 2013.
U.S. Appl. No. 13/874,121 by Degtiar, filed Apr. 30, 2013.
U.S. Appl. No. 13/874,085 by Cabiri, filed Apr. 30, 2013.
U.S. Appl. No. 13/874,017 by Cabiri, filed Apr. 30, 2013.
Int'l Search Report and Written Opinion issued Jul. 26, 2013 in Int'l Application No. PCT/US2012/039465.
Int'l Search Report and Written Opinion issued Aug. 5, 2013 in Int'l Application No. PCT/US2013/033118.
U.S. Appl. No. 13/964,651 by Gross, filed Aug. 12, 2013.
Office Action issued Aug. 15, 2013 in CN Application No. 200880117084.X.
Office Action issued Oct. 9, 2013 in IL Application No. 208634.
Office Action issued Nov. 5, 2013 in JP Application No. 2010-527595.
Office Action issued Sep. 29, 2013 in CN Application No. 201080040968.7.
Office Action issued Nov. 4, 2013 in EP Application No. 11 709 234.6.
Office Action issued Dec. 17, 2013 in JP Application No. 2012-529808.
Office Action issued Dec. 10, 2013 in CN Application No. 201180006567.4.
Office Action issued Jan. 8, 2014 in U.S. Appl. No. 13/521,167 by Cabiri.
U.S. Appl. No. 29/479,307 by Norton, filed Jan. 14, 2014.
U.S. Appl. No. 14/193,692 by Gross, filed Feb. 28, 2014.
Office Action issued Feb. 4, 2014 in EP Application No. 11 707 942.6.
English translation of an Office Action issued Mar. 5, 2014 in CN Application No. 200880117084.X.
Int'l Search Report and Written Opinion issued Apr. 3, 2014 in Int'l Application No. PCT/US2013/078040.
Extended European Search Report issued Mar. 27, 2014 in EP Application No. 14154717.4.
Office Action issued Feb. 28, 2014 in CN Application No. 201180006571.0.
U.S. Appl. No. 14/258,661 by Cabiri, filed Apr. 22, 2014.
Int'l Search Report and Written Opinion issued Jan. 7, 2014 in Int'l Application No. PCT/US2013/065211.
Office Action issued May 23, 2014 in U.S. Appl. No. 13/472,112 by Cabiri.
Office Action issued Jun. 3, 2014 in JP Application No. 2010-527595.
Office Action issued Jul. 7, 2014 in U.S. Appl. No. 12/244,666 by Gross.
Int'l Search Report and Written Opinion issued Jul. 31, 2014 in Int'l Application No. PCT/US2014/033598.
Extended European Search Report issued Aug. 7, 2014 in EP Application No. 1417477.4.
Office Action issued Aug. 6, 2014 in EP Application No. 11 707 942.6.
Office Action issued Sep. 2, 2014 in JP Application No. 2012-550069.
Office Action issued Sep. 2, 2014 in JP Application No. 2012-550068.
Office Action issued Aug. 26, 2014 in CN Application No. 201180006567.4.
Int'l Preliminary Report on Patentability issued Oct. 9, 2014 in Int'l Application No. PCT/US2013/033118.
Office Action issued Oct. 9, 2014 in U.S. Appl. No. 13/873,335.
Office Action issued Nov. 5, 2014 in U.S. Appl. No. 13/643,470 by Alon.
U.S. Appl. No. 14/553,399 by Cabiri, filed Nov. 25, 2014.
Office Action issued Nov. 2, 2014 in CN Application No. 201180006571.0.
Office Action issued Nov. 21, 2014 in U.S. Appl. No. 13/472,112 by Cabiri.
Office Action issued Nov. 21, 2014 in U.S. Appl. No. 13/429,840 by Cabiri.
Int'l Preliminary Report on Patentability issued Nov. 27, 2014 in Int'l Application No. PCT/US2013/039465.
U.S. Appl. No. 14/593,051 by Gross, filed Jan. 9, 2015.
U.S. Appl. No. 14/683,193 by Cabiri, filed Apr. 10, 2015.
Office Action issued Feb. 20, 2015 in U.S. Appl. No. 13/521,181 by Cabiri.
Office Action issued Feb. 24, 2015 in U.S. Appl. No. 14/258,661 by Cabiri.
Extended European Search Report issued Feb. 23, 2015 in EP Application No. 14166596.8.
Office Action issued Mar. 10, 2015 in U.S. Appl. No. 13/643,470 by Alon.
Office Action issued Mar. 10, 2015 in U.S. Appl. No. 12/244,666 by Gross.
Extended European Search Report issued Feb. 23, 2015 in EP Application No. 14166591.9.
Office Action issued Mar. 10, 2015 in CN Application No. 201180006567.4.
Office Action issued Mar. 31, 2015 in JP Application No. 2012-550068.
U.S. Appl. No. 14/715,791 by Cabiri, filed May 19, 2015.
U.S. Appl. No. 14/725,009 by Bar-El, filed May 29, 2015.
Office Action issued Jun. 4, 2015 in U.S. Appl. No. 13/667,739 by Cabiri.
Int'l Preliminary Report on Patentability issued May 14, 2015 in Int'l Application No. PCT/US2013/065211.
Office Action issued May 7, 2015 in JP Application No. 2012-550069.
Office Action issued May 13, 2015 in CN Application No. 201380025566.3.
Office Action issued Jul. 31, 2015 in U.S. Appl. No. 13/521,181 by Cabiri.
Office Action issued Aug. 13, 2015 in U.S. Appl. No. 14/553,399 by Cabiri.
Notice of Allowance issued Aug. 24, 2015 in U.S. Appl. No. 29/479,307 by Norton.

* cited by examiner

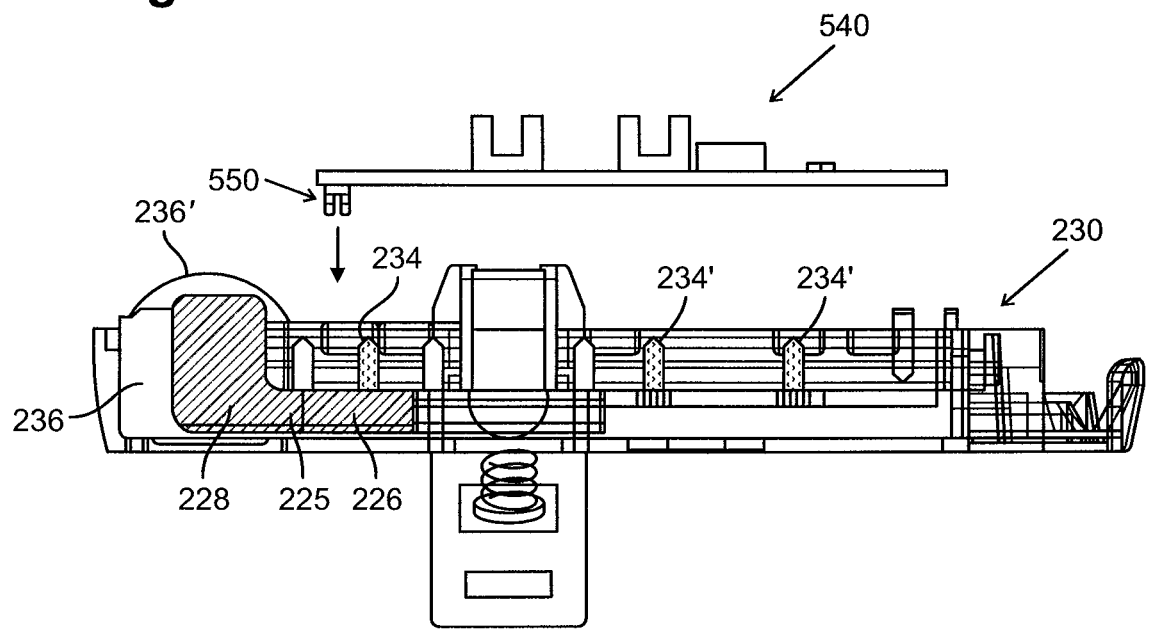

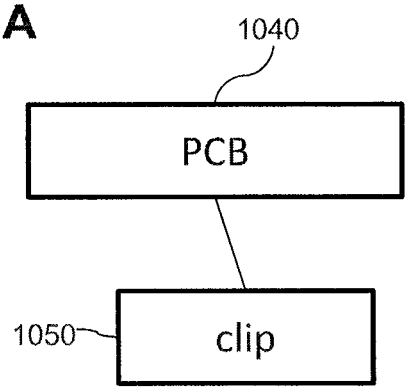
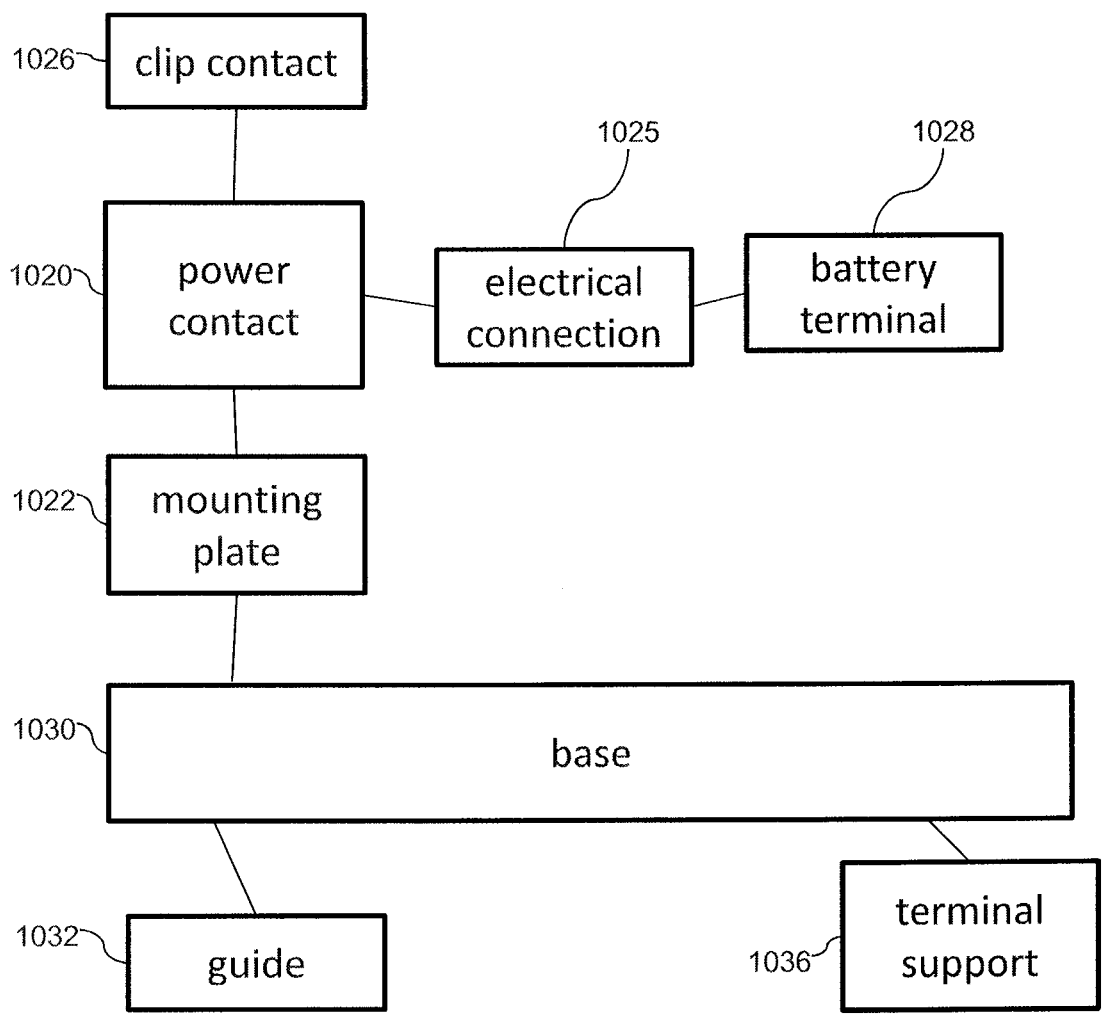
Figure 10A

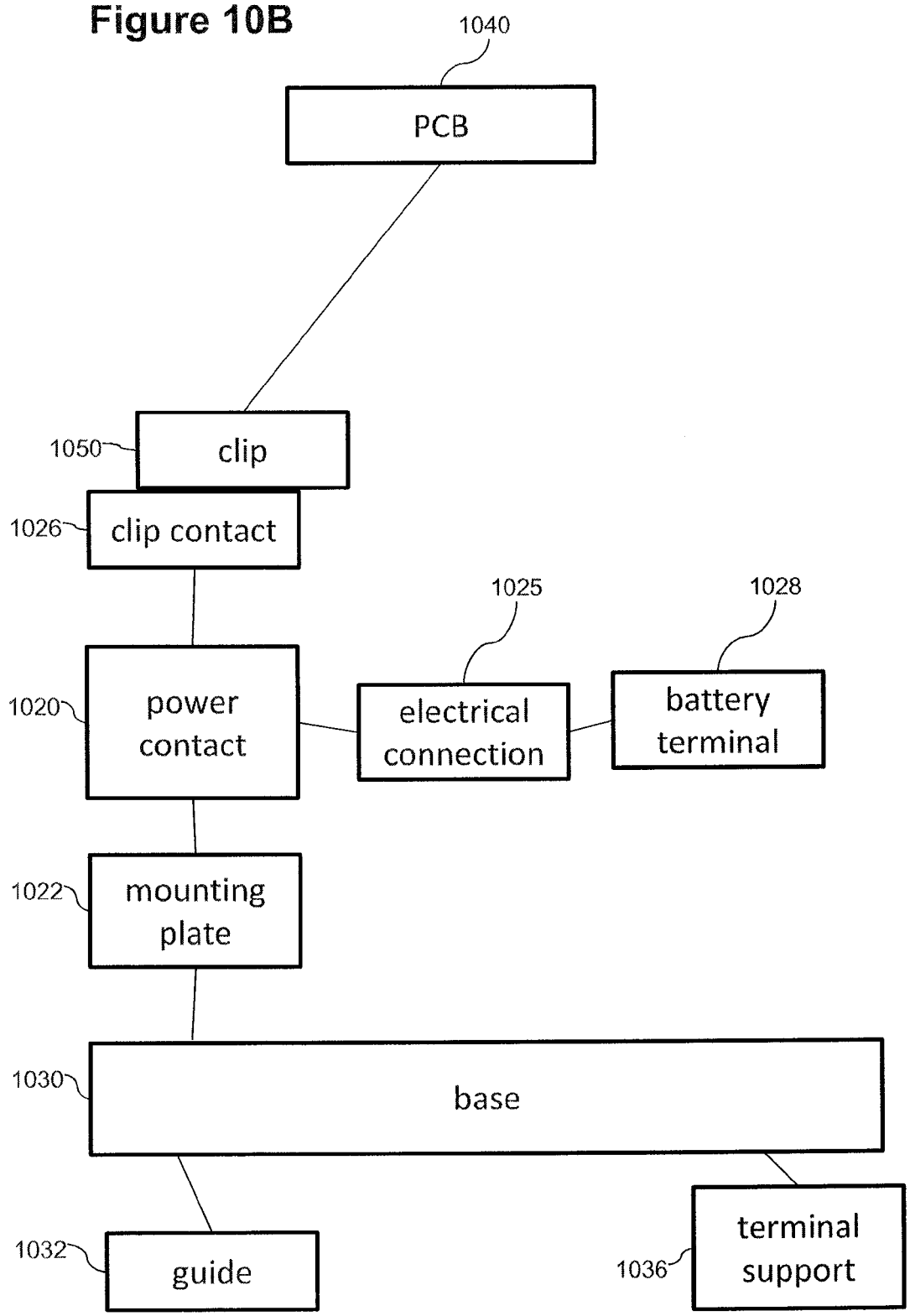

POWER SUPPLY CONTACT FOR INSTALLATION OF PRINTED CIRCUIT BOARD

CROSS-REFERENCE TO RELATED APPLICATIONS

This application is a continuation of U.S. patent application Ser. No. 13/873,335, filed Apr. 30, 2013, the entire contents of which are incorporated by reference herein.

BACKGROUND OF THE INVENTION

The present invention, in some embodiments thereof, relates to a contact clip for a printed circuit board (hereafter referred to as "PCB") and, more particularly, but not exclusively, to a contact for connection to a power supply for surface installation of a PCB with reduced stress on the PCB.

U.S. Pat. No. 6,722,916 to Buccinna et al. discloses an electronic component that includes a PCB having first and second battery contacts. A battery clip having a bottom portion is connected to the first battery contact. The battery clip also includes a top portion spaced from the PCB with a tab extending from the top portion in a downward direction toward PCB. A coin cell battery is arranged between the battery clip and the second battery contact. The present invention battery clip biases the battery into engagement with the second battery contacts with the tab. The second battery contacts may be provided by a solder bump or a printed circuit preferably arranged in a criss-cross waffle shaped pattern. The battery clip is secured to the first battery contacts preferably by applying a solder paste that is heated to electrically join the battery clip to the first battery contacts.

U.S. Pat. No. 7,501,587 to English discloses clips that may be compatible with surface mount technology. The clips may be surface mountable to a substrate for allowing repeated releasable attachment and detachment of a shielding structure thereto. In one exemplary embodiment, a clip generally includes a base member having generally opposed first and second side edge portions. Two or more arms extend generally upwardly in a first direction from the base member. The clip also includes a generally flat pick-up surface configured to enable the clip to be picked up by a head associated with pick-and-place equipment.

U.S. Pat. No. 7,488,181 to Van Haaster discloses contacts that may be compatible with surface mount technology. The contacts may be surface mountable for establishing an electrical pathway (e.g., electrical grounding contact, etc.) from at least one electrically-conductive surface on the substrate to another electrically-conductive surface (e.g., EMI shield, battery contact, etc.). In one exemplary embodiment, a contact generally includes a resilient dielectric core member. At least one outer electrically-conductive layer is electrocoated onto the resilient dielectric core member. A solderable electrically-conductive base member may be coupled to the resilient core member and/or the outer electrically-conductive layer. The base member may be in electrical contact with the outer electrically-conductive layer.

U.S. Pat. No. 7,034,223 to Fan discloses a PCB mounting apparatus including a supporting plate defining a number of through holes, a number of standoffs engaging in the through holes, and a number of grounding members attached to the standoffs. The standoff each includes a head having a holding portion, a flange a post, and a base. The grounding member each includes a first ring supported on the flange, a second ring supported on the base, and a band connecting therebetween. The PCB defines a number of fixing apertures. The combined standoff and grounding member is disposed in the through hole. The PCB is placed upon the supporting plate with the fixing apertures engaging the holding portions of the standoffs and contacts the first rings of the grounding members. The standoffs and the grounding members are made of conductive materials.

BRIEF SUMMARY OF THE INVENTION

According to an aspect of some embodiments of the present invention there is provided method of mounting a PCB to a power supply including pushing the PCB into position on a mounting, and simultaneously engaging mechanically a PCB-to-power-contact connected to the PCB to a PCB contact connected to the mounting and electrically connecting the PCB-to-power-contact to the PCB contact.

According to some embodiments of the invention, the engaging includes forming a friction contact between the PCB-to-power-contact and the PCB contact.

According to some embodiments of the invention, the engaging includes clasping a rail from opposite sides.

According to some embodiments of the invention, the engaging includes sliding the rail between two fingers, wherein the two fingers are mounted parallel to a direction of the pushing.

According to some embodiments of the invention, the sliding includes elastically deforming the fingers to admit the rail between the fingers.

According to some embodiments of the invention, a first force between at least one of the fingers and the rail is at least partially balanced by a second of the forces between at least a second of the fingers and the rail.

According to some embodiments of the invention, the net force on the rail is less than a tenth of the sum of the magnitudes of individual forces on the rail.

According to some embodiments of the invention, the method may further include directing the PCB to the position with a guide.

According to some embodiments of the invention, the method may further include fixing a location of the PCB contact with respect to the mounting.

According to some embodiments of the invention, the method may further include locating a power supply terminal separate from the fixing of the PCB contact.

According to some embodiments of the invention, the method may further include joining the PCB contact to the power supply terminal with an adaptor element.

According to some embodiments of the invention, the pushing is in a direction substantially perpendicular to a plane of the PCB.

According to some embodiments of the invention, after the engaging, the PCB-to-power-contact resists disconnection from the PCB contact without requiring an external force.

According to some embodiments of the invention, after the engaging, the PCB-to-power-contact resists disconnection from the PCB contact.

According to some embodiments of the invention, after the engaging, the electrical connecting remains stable without stressing the PCB.

According to an aspect of some embodiments of the present invention there is provided a system for mounting a PCB to a power supply including: a PCB contact positioned on a mounting for the PCB, a PCB-to-power-contact positioned on the PCB, and a friction contact mechanically engaging and electrically connecting the PCB-to-power-contact to the PCB contact without requiring an external force from the PCB.

According to some embodiments of the invention, wherein the friction contact includes at least two fingers extending perpendicular to a plane of the PCB, the fingers configured for sliding onto opposite sides of a rail.

According to some embodiments of the invention, in an unstressed state the fingers are positioned on opposite sides of a gap and wherein the gap is configured for sliding a rail into the gap, elastically deforming the fingers to grasp opposite sides of the rail.

According to some embodiments of the invention, during the mechanical engaging, the at least two fingers are elastically stressed by the rail in opposing directions by forces from the rail that at least partially counter balance each other, the net force being less than the sum of the magnitudes individual forces.

According to some embodiments of the invention, the stresses on the fingers are in a direction substantially parallel to a plane of the PCB.

According to some embodiments of the invention, during the mechanical engaging, the at least two fingers are elastically stressed by the rail in opposing directions by forces from the rail that at least partially counter balance each other, the net force being less than a tenth of the sum of the magnitudes individual forces.

According to some embodiments of the invention, the system may further include: a guide positioned on the mounting, the guide configured to direct the positioning prior to the engaging of the friction contact.

According to some embodiments of the invention, a position of the PCB contact is fixed with respect to the mounting.

According to some embodiments of the invention, the system may further include: a power supply terminal and wherein a position of the power supply terminal is fixed separately from the fixing of the PCB.

According to some embodiments of the invention, the system may further include: an adaptor element joining the PCB contact to the power supply terminal.

According to some embodiments of the invention, the friction contact is configured for the engaging in response to pushing in a direction substantially perpendicular to a plane of the PCB.

According to some embodiments of the invention, after the engaging, the PCB-to-power-contact resists disconnection from the PCB contact without requiring an external force.

According to some embodiments of the invention a power supply contact is mountable on a base of a device having a geometry for receiving a power supply and for surface installation of a PCB. The power supply contact includes a base plate mountable on the base of the device, a rail extends upwardly from the base plate, a power supply terminal and an adaptor connecting the rail to the power supply terminal. The rail is in electrical contact with the PCB and the power supply terminal is in electrical contact with the power supply when the PCB and the power supply are installed in the device.

Unless otherwise defined, all technical and/or scientific terms used herein have the same meaning as commonly understood by one of ordinary skill in the art to which the invention pertains. Although methods and materials similar or equivalent to those described herein can be used in the practice or testing of embodiments of the invention, exemplary methods and/or materials are described below. In case of conflict, the patent specification, including definitions, will control. In addition, the materials, methods, and examples are illustrative only and are not intended to be necessarily limiting.

BRIEF DESCRIPTION OF THE DRAWINGS

Some embodiments of the invention are herein described, by way of example only, with reference to the accompanying drawings. With specific reference now to the drawings in detail, it is stressed that the particulars shown are by way of example and for purposes of illustrative discussion of embodiments of the invention. In this regard, the description taken with the drawings makes apparent to those skilled in the art how embodiments of the invention may be practiced.

In the drawings:

FIG. 7 is schematic side view of mounting a PCB in accordance with an embodiment of the present invention;

FIGS. 10A-B are block diagrams of a PCB before and after mounting in accordance with an embodiment of the present invention.

DESCRIPTION OF SPECIFIC EMBODIMENTS OF THE INVENTION

Figure 1:
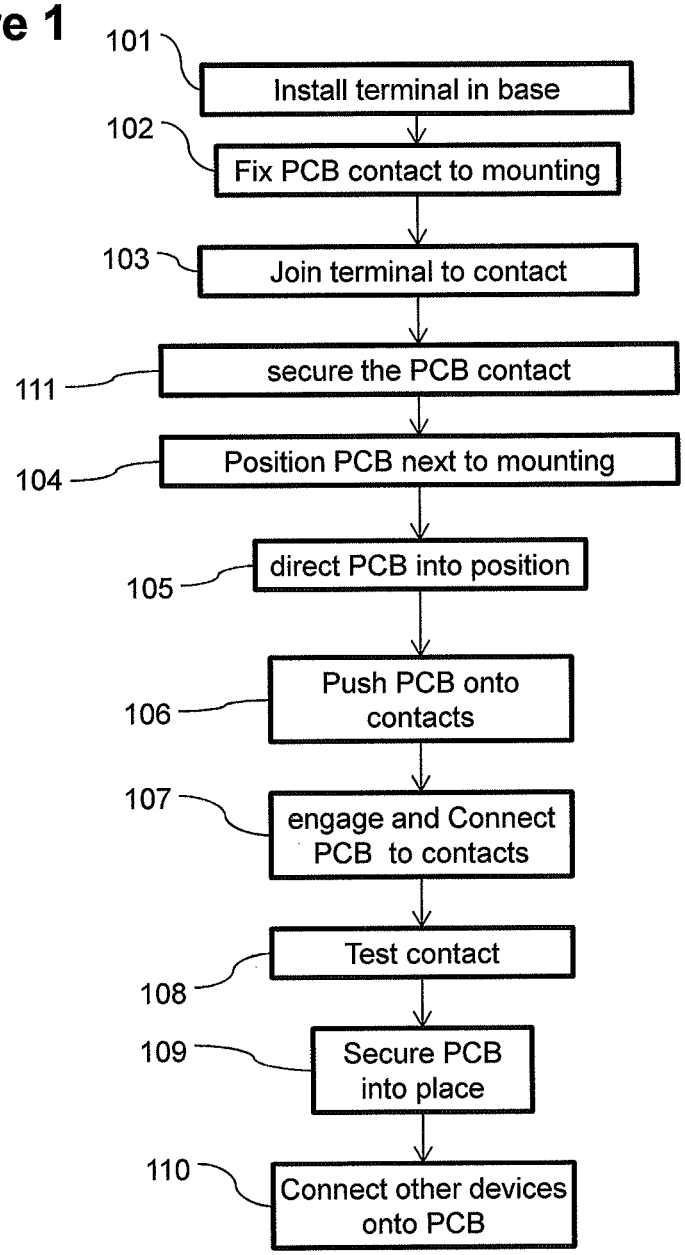
FIG. 1 is a flowchart showing a method of connecting a PCB to a power supply in accordance with an embodiment of the present invention.

The present invention, in some embodiments thereof, relates to a contact clip for a printed circuit board and, more particularly, but not exclusively, to a contact for connection to a power supply for surface installation of a printed circuit board with reduced stress on the PCB.

Overview

Quick Contact for Mounting a PCB to a Device Power Supply

An aspect of some embodiments of the current invention relates to a modular system for mounting a PCB to a device. Modularity may optionally allow replacement of one or more parts without changing the PCB. In this way, it may be possible to change for example the geometry of the device and/or the type of batteries keeping the same PCB and/or PCB contact structure. This may be useful for medical devices where any minor change may require extensive testing and approval of each part that has been changed.

In some embodiments an adaptor element, for example a battery contact, may interconnect between a PCB and an interchangeable part, for example a power supply. For example, a single PCB may be used in multiple models of medical infusers. Optionally different models may include different power supplies. In some embodiments of an infuser, a power supply may be exchanged for a power supply having a different geometry by changing the geometry of the infuser housing to fit the new power supply while keeping the mounting area for the PCB unchanged. Optionally the geometry of the battery contacts may be adjusted to connect between the changed power supply and the unchanged PCB. Optionally, mounting of the PCB may by simple surface mounting without requiring an extra step for connecting the power supply (for example soldering and/or insertion of a plug in a socket). This may optionally facilitate uniform automated assembly of a device containing the PCB.

In some embodiments, a PCB may be mounted by z-assembly. For example the PCB may be mounted from a disconnected state to a connected state by a single vertical push onto a mounting. Power contacts may be optionally be connected by simple z-mounting (for example by pushing the PCB linearly into place). Optionally once connected the power contacts may resist disengagement.

In some embodiments, of a modular system, the battery cavity may be separate from the PCB contacts. For example, the power supply may include a battery cavity and battery terminals. The battery terminals may be in electrical connection with PCB contacts. The location of the terminals may be controlled for example by the shape of the battery cavity while the location of the PCB contacts may be fixed by a PCB contact guide.

An aspect of some embodiments of the current invention relates to a quick power connector for mounting a printed circuit board to a device. The quick connector may simplify disconnection of the PCB for proper disposal and/or recycling.

Drop in Compression and/or Friction Contacts with Reduced Stress on the PCB

An aspect of some embodiments of the current invention relates to compression contacts and/or friction contacts that may connect between a PCB and a power supply when the PCB is dropped into place on a mount. For example, when a PCB is placed on a mounting metal clips may contact a mounting rail. When the PCB is pushed into place the clips may optionally slide onto the rail and/or clasp the rail from opposite sides. Optionally the contact in itself may supply an interface and/or a stable connection and/or an electrical interconnection between the PCB and a power supply. Grasping forces may optionally make a friction and/or pressure contact that remains in contact with the rail without requiring a constant force from the PCB. The grasping forces may optionally make a friction and/or pressure contact that once connected resists disconnection from the rail without requiring an external force, for example from the PCB. The forces of clasping may be balanced on opposite sides of the rail without requiring a constant counter force from the PCB or the rail. When the PCB is placed on the mounting it may be guided by guide members. For example in some embodiments the force needed to engage the clip to a rail may range between 0.01 and 10 N. The engagement force of each clip may be added to the force to push the PCB into place. For example in some embodiments once connected the clip may resist a disengagement force ranging between 0.05 and 1.0 N. The disengagement force of each clip may be added to the force required to disengage the PCB from its mount. Optionally the force to push the PCB into place and/or the disengagement force may be perpendicular to the plane and the PCB. Optionally the force to push the PCB into place and/or the disengagement force may be in the direction of insertion of the PCB. Optionally the force to push the PCB into place and/or the disengagement force may be perpendicular to a PCB mount.

For example in some embodiments as a PCB is lowered into place via z-assembly, the contacts may interconnect. For example, a clip may have fingers directed parallel to the direction of insertion of the PCB and/or perpendicular to the plane of the PCB. Optionally the fingers may have a gap into which a rail penetrates, as the PCB is pushed into place. The width of gap may range, for example, between 0.3 to 1.0 mm. For example in some embodiments the length of fingers may range between 1 and 4 mm. For example in some embodiments the length of the clip may range between 1 and 10 mm. For example in some embodiments the width of the clip may range between 0.5 and 2.0 mm. For example in some embodiments the thickness of the rail grasped by the clip may range between 0.05 and 0.5 mm.

In some embodiments, the contacts of the current invention may reduce stress on a PCB and/or on mounts used to hold a PCB. For example, the current invention may avoid use of a spring contact that pushes against a contact plate requiring a counter force from the PCB mountings. In some cases, such forces from spring mounts on the PCB may cause mounting pins and/or the PCB to deform over time. Such deformations may in some cases reduce reliability.

For example the PCB contacts may include a clip and a corresponding rail. The contact between the PCB and the power supply may be made by the clip grasping the rail from two sides without stressing the PCB. Alternatively or additionally, the contact between the PCB and the power supply may use a clip that grasps the PCB locally. In some embodiments, the clip may balance stresses locally without requiring counter forces from the PCB mountings. Suitable clip contacts may include for example S1711 and/or S1721 shielding clips available from Harwin Inc., 7B Raymond Avenue, Unit 11, Salem, N.H. 03079, USA. Specifications are published as the S1711 and/or S1721 Customer Information Sheet which are incorporated herein by reference.

In some embodiment power supply clips and/or respective contacts may extend between the base and the PCB. A PCB mount may be configured to extend between the base and the PCB while the PCB is adjacent to the base. Optionally, the guide may direct the PCB into position before the power supply clips reach the contacts.

Exemplary Detailed Embodiments

Before explaining at least one embodiment of the invention in detail, it is to be understood that the invention is not necessarily limited in its application to the details of construction and the arrangement of the components and/or methods set forth in the following description and/or illustrated in the drawings and/or the Examples. The invention is capable of other embodiments or of being practiced or carried out in various ways.

Method of Mounting PCB

Referring now to the drawings, FIG. 1 is a flow chart illustration of an exemplary embodiment of a method of mounting a PCB into a device with a power supply contacts. In the exemplary embodiment of FIG. 1, the power supply includes batteries, a battery cavity and battery contacts. Optionally, the battery contacts are installed into the device separately from the PCB. The battery contacts may optionally include a battery terminal in electrical connection with a PCB contact. Optionally the battery terminals are supported and/or located separately from the PCB contact. The PCB may optionally be lowered onto mounts that may serve also as guides for positioning the PCB and then onto the contacts without requiring an extra step of for example soldering and/or plugging in a power cord.

In some embodiment, a power supply terminal may be installed 101 into the base of the device. Optionally, guides for directing engagement of a PCB contact may be fixed 102 in a PCB mounting (for example the PCB mounting may include a section of the base having a PCB positioning guide and/or a PCB contact guide for directing 105 placement of the PCB and/or fixing 102 a location of a PCB contact). In some embodiments, the terminal supports and/or the PCB positioning guides and/or the PCB contact locators may optionally be separate and/or independent from each other. In some embodiments, the terminal supports and/or the PCB positioning guides and/or the PCB contact locator may optionally be located in a specified relative geometry. The PCB mounts may optionally be long enough that they direct 105 positioning of the PCB while it is adjacent to the mounting base before PCB-to-power-contacts on the PCB reach the PCB contacts on the mounting.

In some embodiments an adapter element may join 103 the PCB contacts to the power supply terminals. For example, the terminals may be installed 101 into the base with a terminals support (for example a battery cavity) and/or the PCB contacts may be precisely fixed 102 in their location (for example on the PCB mounting) by a PCB contact guide and/or the PCB contact may be joined 103 to the terminal by a flexible conductive metal ribbon.

In some embodiments installing 101 power terminals and/or fixing 102 PCB contacts and/or joining 103 the contacts to the terminals may be performed simultaneously. For example, a single piece battery contact (for example the contacts 220, 220' of FIGS. 3A-B) may be a single piece including power terminals (for example the terminals 228, 228' (for example see detailed view of FIGS. 3A-B)) and/or a joining element (for example the ribbon 225, 225') and/or a PCB contact (for example the rail 226). Optionally lowering the contact 220, 220' onto a base (for example by z-assembly) may simultaneously accomplish installing 101 power terminals and/or fixing 102 PCB contacts and/or joining 103 the contacts to the terminals.

In some embodiments, the PCB contact may be secured 111 to the PCB mounting. For example, the PCB locator includes a mounting pin; the battery contacts may be secured 111 by hot melting the mounting pins.

In some embodiments, after the PCB contacts are in place, the PCB may be installed simply by positioning 104 the PCB adjacent to the mounting. When the PCB is positioned 104 next to the mounting it may optionally engage a PCB guide. The PCB guide may, for example, direct 105 the PCB into its correct position on the mounting. Optionally, gentle push 106 may engage the PCB-to-power-contact to on the PCB to the PCB contact on the PCB mounting.

In some embodiments, mounting may be simple vertical lowing of the PCB onto the base. Optionally mounting may not require complex motions and/or action (for example tilting and/or translating the PCB, and/or soldering contacts and/or plugging in cords). For example, the PCB guide may include a mounting pin. Optionally during positioning 104 the mounting pin may optionally enter holes in the PCB and direct 105 the PCB while it is being pushed 106 into position on the mounting. Optionally, pushing 106 the PCB onto the mounting may engage a PCB-to-power-contact installed on the PCB to a PCB contact on the mounting thereby electrically connecting 107 the PCB to the power supply. For example, PCB-to-power-contact may include a clip and the PCB contact may include a rail. The clip may, optionally, slide onto and/or grasp the PCB contacts. Alternatively or additionally, PCB contact may include a clip that grasps a rail on the PCB.

In some embodiments a test circuit may be included in the PCB. The test circuit may be used to test 108 whether the PCB is in good electrical connection with the PCB contacts.

In some embodiments the PCB may be secured 109 into the base. For example if the PCB mounts are mounting pins, the PCB may be secured 109 by hot melting the mounting pins.

In some embodiments, once the PCB has been mounted, various components may be connected 110 to the surface of the PCB. For example, there may be contacts for an electric motor and/or a rotation sensor for the motor and/or other sensors and/or power supply contacts.

Installing Battery Contacts

Figure 2:
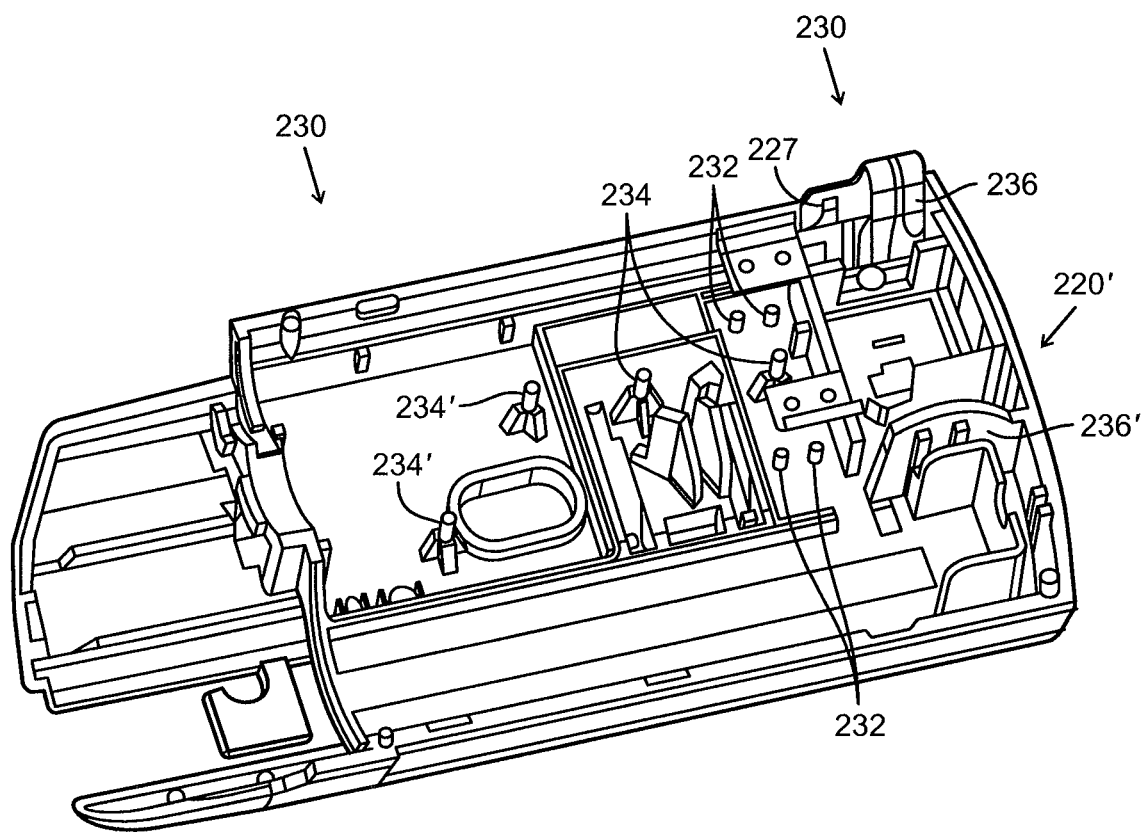
FIG. 2 is a perspective view of two battery contacts being mounted to a base in accordance with an embodiment of the present invention.
Figure 3A:
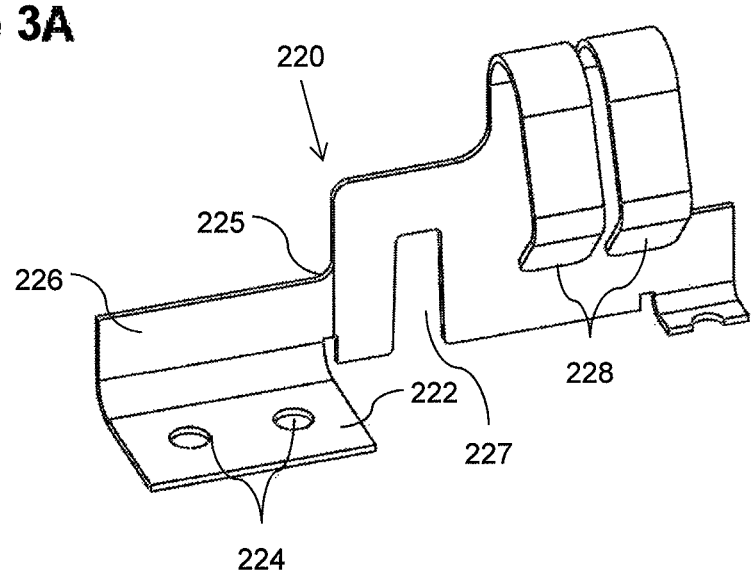
FIGS. 3A-B are a perspective views of two battery contacts in accordance with an embodiment of the present invention.
Figure 3B:
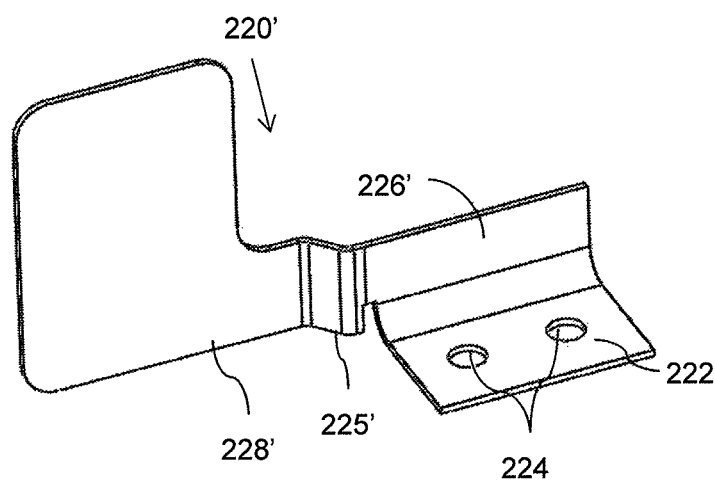

Referring now to further drawings, FIG. 2 is a perspective view of installation of battery contacts (for example contacts 220 and 220') into a base (for example base 230) according to an embodiment of the invention. FIGS. 3A-B are detailed perspective views of exemplary battery contacts 220, 220'. An exemplary relationship is depicted between the battery terminal supports 236, 236' and the PCB contact guides 232. FIG. 2 also illustrates other components of base 230, for example PCB guides 234, 234'.

In some embodiments, positive and negative battery connectors 220, 220' respectively, may be lowered into place on a plastic base 230. For example a negative terminal 228 may be supported by a negative terminal support 236 and/or a positive terminal 228' may be supported by a positive terminal support 236'.

In some embodiments, battery terminal 228 may have multiple redundant fingers, each independently contacting the battery. If one of the fingers is blocked (for example by corrosion and/or dirt), the other finger may supply contact and/or electrical connection.

In some embodiments, PCB connectors may include a rail 226 and a base plate 222. Optionally the base plate 222 may be mounted to the base 230 using guides 232. Guides 232 may optionally pass through holes 224 in the base plate 222 to hold the rail 226 in precise locations for connecting to the PCB. The battery terminals 228, 228' may optionally be electrically joined to the rails 226, 226' via a thin metal ribbons 225, 225'. The metal ribbons 225, 225' may optionally be flexible. Flexibility of the ribbons 225, 225' may optionally facilitate the guides 232 fixing of the rails 226 in their proper location separately from the supporting of the terminals 228, 228'. Flexibility may optionally facilitate fixing of the rails 226 in their proper location regardless of small imprecision and/or movements in the location of the terminals 228, 228'. Connection between the terminals 228, 228' and the PCB connecting the rails 226 may optionally be formed by an adaptor element according to the particular geometry of a device, for example the base 230. For example, an adapter element may include a conducting ribbon that is adapted to the base geometry. For example, the ribbon 225 is straight while the ribbon 225' is bent.

In some embodiments, the ribbon 225 may have a cut out 227 portion. For example, the cut out portion 227 may allow part of the battery support 236 to pass through the ribbon 225. In the exemplary embodiment of FIG. 4A, the part of battery support 236 passing through the cut out 227 has a triangular form. The support 236 passing through the cut out 227 may, optionally, guide the ribbon 225 and/or stabilize the ribbon 225 in position.

In some embodiments, the battery connectors 220, 220' are monolithic elements. For example, each connector 220, 220' may be made of a single piece of metal. Alternatively or additionally, each connector 220, 220' may be made of multiple components.

Modification of the Power Source without Changing the PCB

Figure 4A:
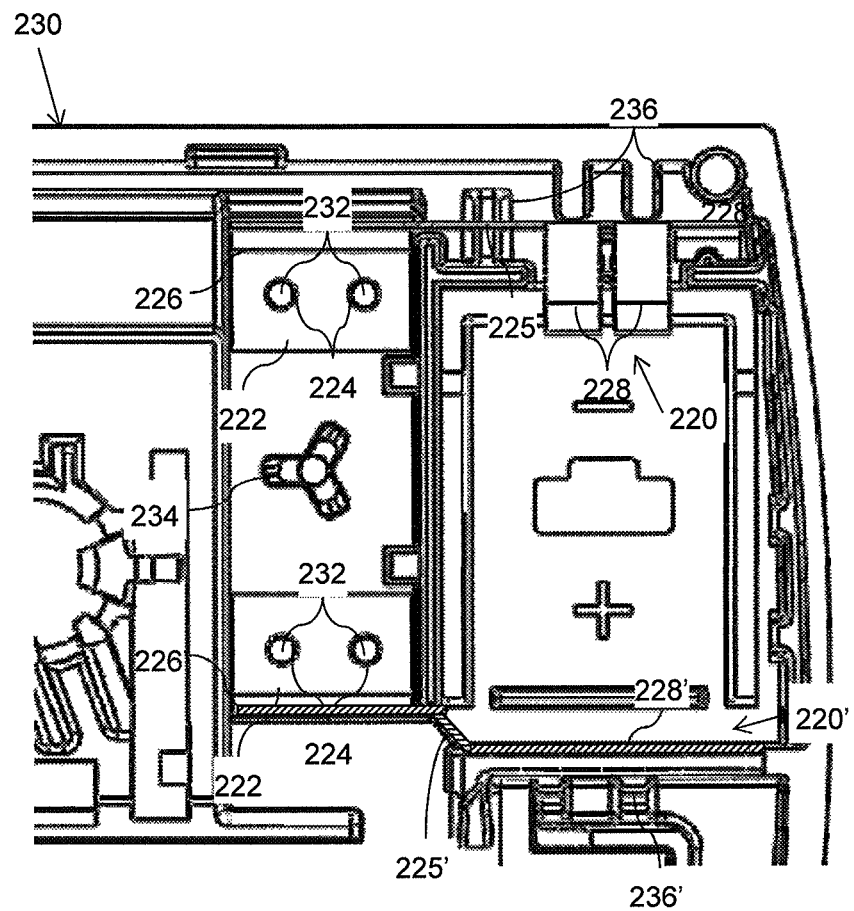
FIGS. 4A-B are overhead schematic views of battery contacts mounted to a base in accordance with alternate exemplary embodiments of the present invention.
Figure 4B:
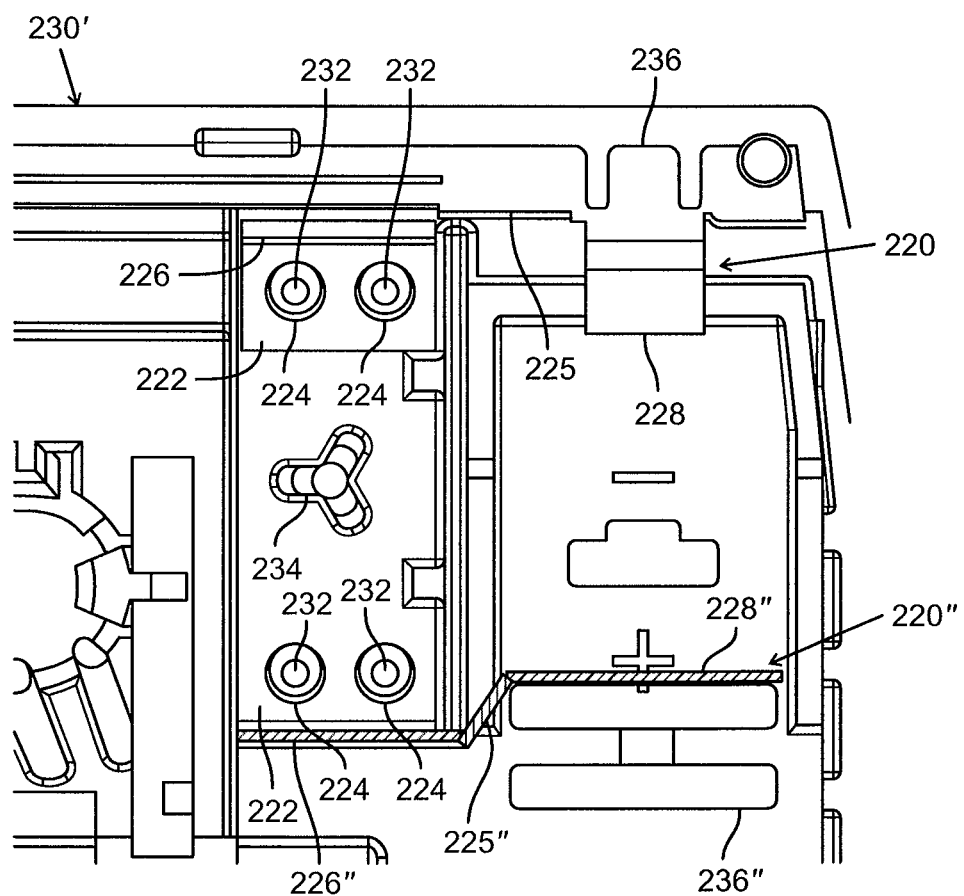

Referring now to further drawings, FIGS. 4A and 4B illustrate an example of modifying a power source without modifying a PCB that controls a device using the power source.

FIG. 4A is an over head illustration of the embodiment of FIGS. 2 and 3. In the example of FIG. 4A the power source includes the battery terminals 228, 228' and the supports 236, 236' and is configured for holding three AG13 button batteries (not shown).

FIG. 4B is an over head illustration of an alternative embodiment of a device including a modified connector 220". In the example of FIG. 4B a base 230', the battery terminals 228, 228" and the supports 236,236" are configured for holding three AG12 button batteries (not shown). AG 12 batteries may be smaller than AG13 batteries. To accommodate the smaller batteries, the supports 236" and 236 are closer together than the corresponding supports 236, 236' of base 230. Nevertheless, the PCB connectors (rails 226) of the battery connectors remain in the same locations. In order to connect the terminal 228" to its corresponding PCB connector rail 226' in the modified geometry of FIG. 4B, the ribbon 225" is optionally bent in an opposite direction from ribbon 225'.

Clip Contacts

Figure 5:
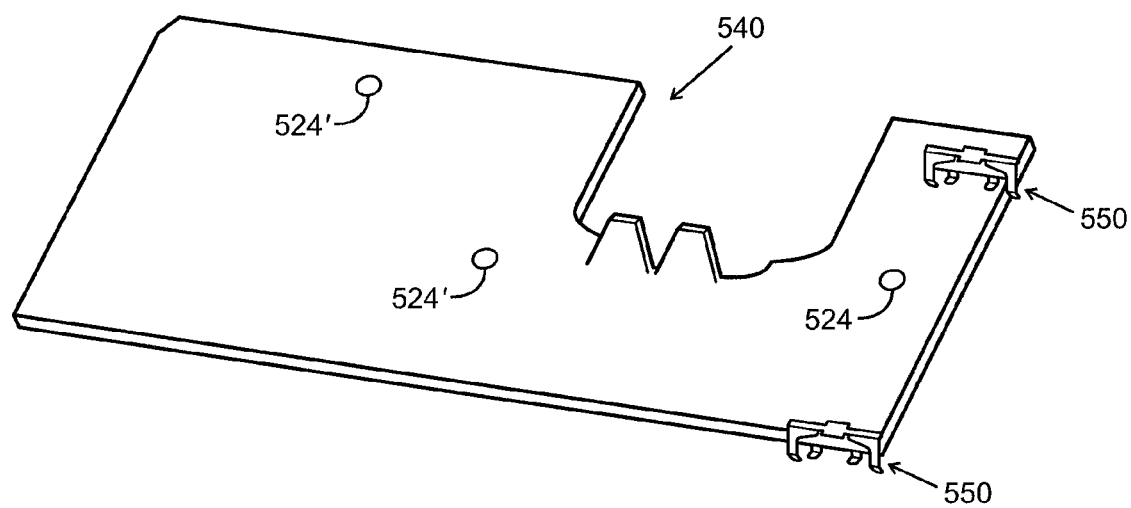
FIG. 5 is a perspective view of a PCB with PCB-to-power-contacts in accordance with an embodiment of the present invention.
Figure 6A:
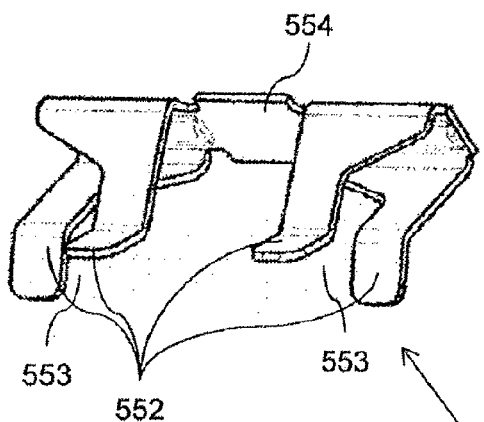
FIGS. 6A-C are three views of a PCB-to-power-contact in accordance with an embodiment of the present invention.
Figure 6B:
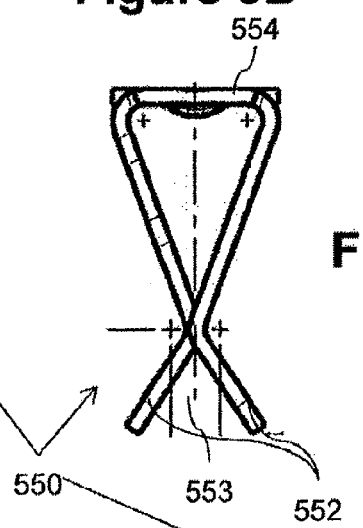
Figure 6C:
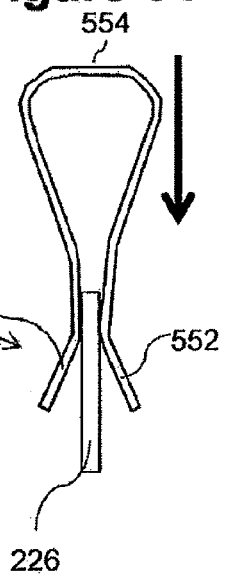

Referring now to further drawings, FIG. 5 is a perspective view illustration of an exemplary embodiment of a PCB 540 with a PCB-to-power-contact, for example the clips 550, for connecting to a power source. FIGS. 6A-C are detail views of an exemplary clip 550.

FIG. 5 illustrates an exemplary embodiment clip 550 mounted on the bottom of a PCB 540. For example, the clips 550 extend downward from the bottom of the PCB 540 in a direction substantially perpendicular to the plane of PCB 540. In some embodiments, a PCB (for example PCB 540) may include guide holes 524, 524'. Pins (for example PCB guides 234, 234') may line up with guides holes 524, 524' to position the PCB 540 for proper mounting (for example to the base 230). In the exemplary embodiment of the PCB 540 and the base 230, the guide 234 fits in the hole 524 located between the clips 550. The close proximity of the guide 234 and the guide hole 524 to the clips 550 may facilitate precise locating of the clips 550 as they are lowered onto the rails 226.

FIG. 6A is a perspective view of an exemplary embodiment of the clip 550. The clip 550 optionally includes a base 554 for connecting to a contact on the PCB 540. The clip 550 optionally includes two sent of fingers 552. Optionally, the fingers 552 and the base 554 are formed from a single integral piece of metal, for example of spring steel.

In alternative exemplary embodiment a clip contact may have more or less than four fingers. For example, a clip may have three fingers, for example one finger in the middle and opposing fingers on either side. Optionally, a clip may have five, six or more fingers.

FIGS. 6B and 6C illustrate a side view of an exemplary embodiment of a contact clip (for example clip 550). The base of the fingers 552 may optionally be bent until the fingers 552 close together. The end of fingers 552 may be bent back outward to produce the gap 553. As illustrated in FIG. 6C, the clip 550 may be lowered onto a rail (for example the rail 226) having the form of a vertical metal plate. The rail 226 slides into the gap 553. As the clip 550 is pushed downward, the rail 226 pushes apart the fingers 552 and slides between the fingers 552.

In some embodiments, as the fingers 552 spread, admitting the rail 226 into the gap 553, the fingers 552 are elastically deformed. The fingers 552 may optionally spring back to grasp the rail 226 from two sides, for example as illustrated in FIG. 6C. Contact between the fingers 552 and the rail 226 may supply an electrical connection between the PCB 540 and the PCB contacts.

In some embodiments, friction and/or compression forces between the fingers 552 and the rail 226 may resist disconnection. The forces and/or torques produced by the contact between the fingers 552 and the mounting plate 226 may optionally be balanced such that the clip 550 holds to the rail 526 without requiring an external restraining force and/or torque for example from the base 230 and/or the PCB 540 and/or the guides 234 and/or the guides 232 that join them without requiring an external force to hold the clip 550 to the rail 226. For example, opposite fingers 552 may apply forces to the rail in opposite directions. In the example friction between the fingers 552 and the rail 226 may resist disconnection according to the sum of the magnitude of the force between the fingers 552 and the rail 226. The net force and or torque on the base 554 and or the rail 226 may be the vector sum of the forces and/or torques. Opposite forces and torques may have vector forces that substantially nullify each other. For example, in some embodiments the net force may range between half and a tenth of the sum of the force magnitudes. For example, in some embodiments the net force may be less than a tenth the sum of the force magnitudes. Additionally or alternatively, other mounting clips (for example various forms of grounding clips) may be used as contacts between a PCB and a power supply.

Mounting a PCB with Power Source Connecting Contacts

Figure 8:
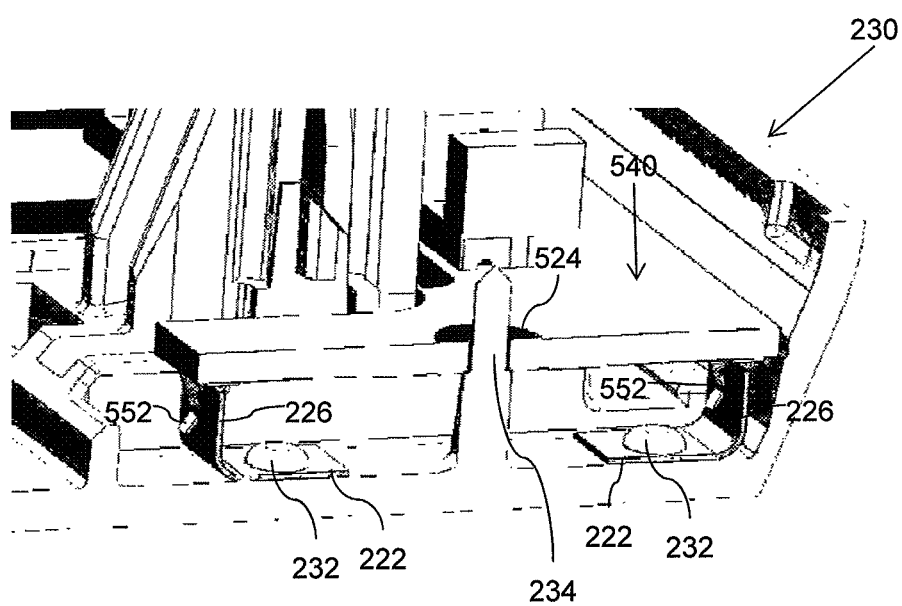
FIG. 8 is perspective cut away view of a mounted PCB in accordance with an embodiment of the present invention.

Referring now to further drawings, FIG. 7 is a schematic partial cutaway side view of the mounting of an exemplary PCB 540 onto an exemplary base 230 and FIG. 8 is a perspective front cutaway view of the PCB 540 and the base 230 showing the fingers 552 clasping the rails 226.

As illustrated in FIG. 7, pushing the PCB 540 onto the base 230 guided by the guides 234, 234' may optionally bring together the clip 550 and the rail 226 in a desired direction. For example, the clip 550 may contact with the rail 226 in a direction substantially perpendicular to the plane of the PCB 540. Bringing together the clip 550 and the rail 226 in the desired direction may optionally mechanically engage the clip 550 to the rail 226 and complete a connection between the clip 550 and the rail 226 supplying an electrical connection between the power supply and the PCB 540. The resulting engagement is illustrated in FIG. 8. Installing the PCB 540 to the mounting of the base 230 may optionally be completed by hot melting the top of the guide 234, 234' to secure the PCB 540 into place. The guides 232 are illustrated in FIGS. 8, 9A and 9B after hot melting.

Figure 9A:
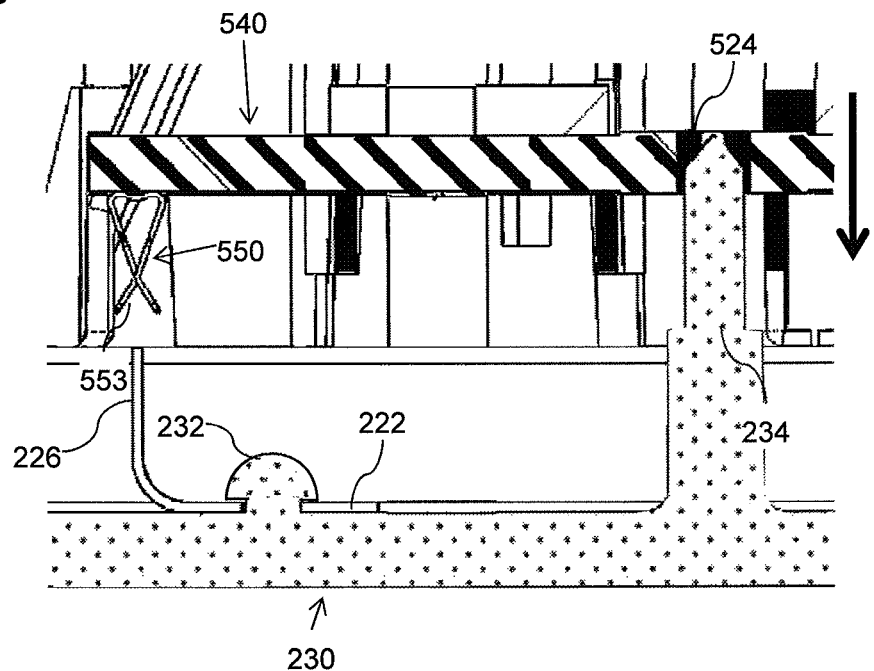
FIGS. 9A-B are front cut away views of mounted PCBs in accordance with alternate exemplary embodiments of the present invention.
Figure 9B:
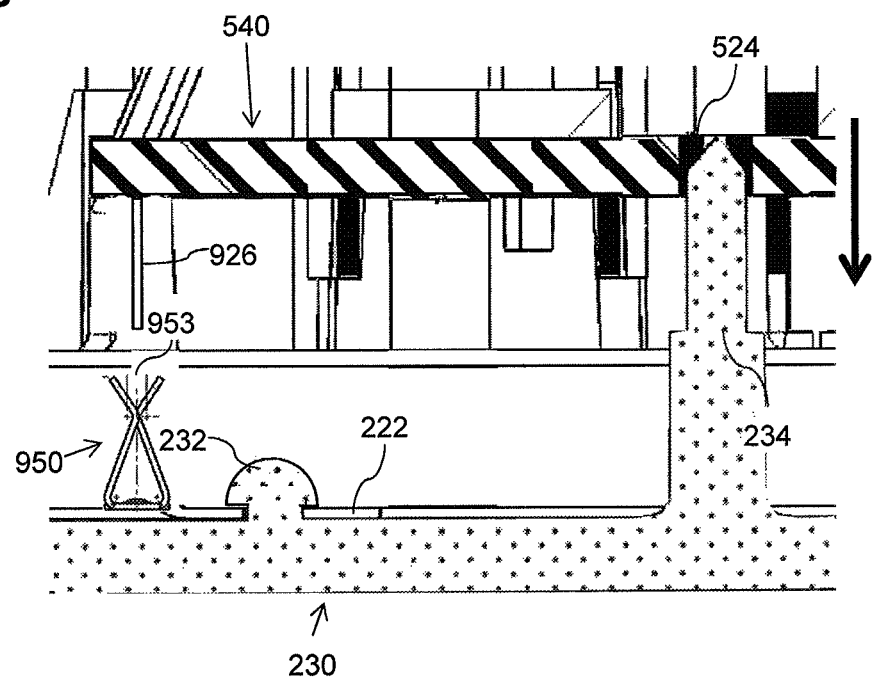

FIGS. 9A and 9B illustrate close up schematic partial cutaway views of two alternate exemplary embodiments of the PCB power connection clips 550, 950. For example, FIG. 9A illustrates an embodiment that corresponds to FIGS. 2-8 wherein a clip 550 mounted on the bottom of the PCB 540 connects to a rail 260 on the battery contacts 220. FIG. 9B illustrates an alternative embodiment wherein a rail 926 mounted on the bottom of the PCB 540 connects to a clip 950 on the battery contacts 220.

FIGS. 9A,B also illustrate that in the exemplary embodiments of FIGS. 4A,B the guide 234 is optionally longer than the combined lengths of corresponding pairs of the rails 226 or 926 and the clips 550 or 950. As the PCB 540 is positioned over the base 230, the guides 234 optionally enter holes 524 before the clip 550, 950 contacts corresponding the rail 226, 926. The guide 234 may guide the rails 226, 926 to precisely slide into the gaps 553, 953 of corresponding the clips 550, 950.

A System for Connecting a PCB to a Power Supply

Referring now to further drawings, FIGS. 10A, B are block diagrams of a system for mounting a PCB to a power supply. FIG. 10A shows the system before mounting and FIG. 10B shows the system after mounting.

In some embodiments, a PCB 1040 may include a clip 1050 on a face to be mounted onto a base (for example base 1030). The clip 1050 may include for example the clip 550 as described herein above or various clip contacts known in the art (for example as described in U.S. Pat. No. 7,501,587 and/or U.S. Pat. No. 7,488,181 where are incorporated in their entirety by reference into the specification).

In some embodiments, the clip 1050 may form a connection to a clip contact 1026 included in a power contact 1020. For example the connection may be formed by simply pressing the clip 1050 onto the clip contact 1026. Optionally, the forces between the clip 1050 and the clip contact 1026 may be balanced so that they do not require a counter force and/or torque from the PCB 1040 and/or the power contact 1020. An electrical connection 1025 may be supplied between the clip contact 1026 and a battery terminal 1028. In some embodiments the contact 1020 may include a mounting plate 1022 for mounting to the base 1030.

In some embodiments the base 1030 may include the guides 1032 to position the PCB 1040 and/or the contact 1020 during mounting of the PCB 1040 to the base 1030 and the power contact 1020.

In some embodiments the base 1030 may include a terminal support 1036.

It is expected that during the life of a patent maturing from this application many relevant PCB connectors will be developed and the scope of the terms contacts, clips, rails and connectors is intended to include all such new technologies a priori.

As used herein the term "about" refers to ±5%.

The terms "comprises", "comprising", "includes", "including", "having" and their conjugates mean "including but not limited to".

The term "consisting of" means "including and limited to".

The term "consisting essentially of" means that the composition, method or structure may include additional ingredients, steps and/or parts, but only if the additional ingredients, steps and/or parts do not materially alter the basic and novel characteristics of the claimed composition, method or structure.

As used herein, the singular form "a", "an" and "the" include plural references unless the context clearly dictates otherwise. For example, the term "a compound" or "at least one compound" may include a plurality of compounds, including mixtures thereof.

Throughout this application, various embodiments of this invention may be presented in a range format. It should be understood that the description in range format is merely for convenience and brevity and should not be construed as an inflexible limitation on the scope of the invention. Accordingly, the description of a range should be considered to have specifically disclosed all the possible subranges as well as individual numerical values within that range. For example, the description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 3, 4, 5, and 6. This applies regardless of the breadth of the range.

Whenever a numerical range is indicated herein, it is meant to include any cited numeral (fractional or integral) within the indicated range. The phrases "ranging/ranges between" a first indicate number and a second indicate number and "ranging/ranges from" a first indicate number "to" a second indicate number are used herein interchangeably and are meant to include the first and second indicated numbers and all the fractional and integral numerals therebetween.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable subcombination or as suitable in any other described embodiment of the invention. Certain features described in the context of various embodiments are not to be considered essential features of those embodiments, unless the embodiment is inoperative without those elements.

All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention. To the extent that section headings are used, they should not be construed as necessarily limiting.

What is claimed is:

1. A power supply contact mountable on a base of a device having a geometry for receiving a power supply and for surface installation of a printed circuit board, the power supply contact comprising:
    a base plate mountable on the base of the device, the base plate lying in a first plane;
    a rail extending upwardly from the base plate in a second plane perpendicular to the first plane;
    a power supply terminal; and
    an adaptor connecting the rail to the power supply terminal,
    wherein the rail is in electrical contact with the printed circuit board and the power supply terminal is in electrical contact with the power supply when the printed circuit board and the power supply are installed in the device.

2. The power supply contact according to claim 1, wherein the power supply contact is monolithic.

3. The power supply contact according to claim 1, wherein the adaptor is a flexible ribbon adaptable to the geometry of the base.

4. The power supply contact according to claim 1, wherein the adaptor is a flexible conductive metal ribbon electrically joining the terminal to the rail.

5. A power supply contact mountable on a base of a device having a geometry for receiving a power supply and for surface installation of a printed circuit board, the power supply contact comprising:
- a base plate mountable on the base of the device;
- a rail extending upwardly from the base plate;
- a power supply terminal; and
- an adaptor connecting the rail to the power supply terminal,
- wherein the rail is in electrical contact with the printed circuit board and the power supply terminal is in electrical contact with the power supply when the printed circuit board and the power supply are installed in the device, and
- wherein the base plate has a terminal support which supports the power supply terminal and the adaptor has a cut out portion allowing a part of the terminal support to pass therethrough.

6. The power supply contact according to claim 1, wherein the power supply terminal is an electrically conductive plate.

7. The power supply contact according to claim 1, wherein the power supply terminal has a plurality of redundant fingers, each finger independently connectable to the power supply.

8. The power supply contact according to claim 1, wherein the base plate has a power supply contact guide in the form of a mounting pin which passes through a hole the base plate.

9. The power supply contact according to claim 1, wherein a thickness of the rail ranges between 0.05 and 0.5 millimeters.

10. A device for receiving a battery having a positive battery contact and a negative battery contact and for surface installation of a printed circuit board, the device comprising:
- a base;
- a battery cavity in the base;
- a first terminal support in the battery cavity;
- a second terminal support in the battery cavity spaced apart from the first terminal support;
- a first power supply contact comprising:
  - a first base plate mounted in the battery cavity;
  - a first rail extending upwardly from the first base plate;
  - a first power supply terminal comprising an electrically conductive plate supported by the first terminal support, the electrically conductive plate electrically connectable to the negative battery contact; and
  - a first adaptor connecting the first rail to the first power supply terminal; and
- a second power supply contact comprising:
  - a second base plate mounted in the battery cavity;
  - a second rail extending upwardly from the second base plate;
  - a second power supply terminal comprising a plurality of redundant fingers supported by the second terminal support, each finger independently electrically connectable to the positive battery contact; and
- an adaptor connecting the rail to the second power supply terminal,
- wherein the first power supply terminal of the first power supply contact is in electrical connection with the negative battery contact and the second power supply terminal of the second power supply contact is in electrical connection with the positive battery contact when the battery is installed in the battery cavity, and
- wherein the first rail of the first power supply contact is in electrical contact with the printed circuit board and the second rail of the second power supply contact is in electrical contact with the printed circuit board when the printed circuit board is installed in the device.

* * * * *